US007611577B2

(12) United States Patent
Nakata

(10) Patent No.: US 7,611,577 B2
(45) Date of Patent: Nov. 3, 2009

(54) SEMICONDUCTOR THIN FILM MANUFACTURING METHOD AND DEVICE, BEAM-SHAPING MASK, AND THIN FILM TRANSISTOR

(75) Inventor: Mitsuru Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 284 days.

(21) Appl. No.: 11/094,570

(22) Filed: Mar. 31, 2005

(65) Prior Publication Data

US 2005/0221569 A1    Oct. 6, 2005

(30) Foreign Application Priority Data

Mar. 31, 2004   (JP)   ............... 2004-104250
Feb. 3, 2005    (JP)   ............... 2005-027938

(51) Int. Cl.
    *H01L 21/336*   (2006.01)
(52) U.S. Cl. ............... 117/53; 117/44; 117/904; 438/487; 438/149; 438/942
(58) Field of Classification Search ............... 257/59, 257/72, 64, 70; 219/121.62, 121.83; 438/486, 438/166, 487, 149, 482, 151, 308, 942; 117/4, 117/89, 90, 92, 95, 44, 53, 58, 63, 904
    See application file for complete search history.

(56) References Cited

U.S. PATENT DOCUMENTS

| | | | | |
|---|---|---|---|---|
| 5,155,791 A | * | 10/1992 | Hsiung | ............... 385/122 |
| 5,767,003 A | * | 6/1998 | Noguchi | ............... 438/487 |
| 6,020,224 A | * | 2/2000 | Shimogaichi et al. | ....... 438/158 |
| 6,072,194 A | * | 6/2000 | Wakita et al. | ............... 257/66 |
| 6,117,752 A | | 9/2000 | Suzuki | |
| 6,281,470 B1 | * | 8/2001 | Adachi | ............... 219/121.62 |
| 6,322,625 B2 | * | 11/2001 | Im | ............... 117/43 |
| 6,440,824 B1 | * | 8/2002 | Hayashi et al. | ............... 438/486 |

(Continued)

FOREIGN PATENT DOCUMENTS

CN    1373500    10/2002

(Continued)

OTHER PUBLICATIONS

Robert S. Sposili et al: Sequential lateral solidification of thin silicon films on SiO2.

*Primary Examiner*—Eric Hug
*Assistant Examiner*—Seyed Masoud Malekzadeh
(74) *Attorney, Agent, or Firm*—Young & Thompson

(57) ABSTRACT

A manufacturing method of a semiconductor thin film decreases the number of and controls the direction of crystal grain boundaries. A first beam irradiated onto amorphous silicon produces a radial temperature gradient centered on a tip of a concave. This forms a crystal grain in the concave tip, which grows in both the beam width and length direction. After the second beam and on, growth is repeated using the crystal grain formed in the tip of the concave as the seed. This forms a band-form crystal grain with a wider than that of the conventional narrow-line beam, with the tip of the concave being the start point. Further, by setting the periphery of the concave pattern to be equal or less than the crystal grain diameter in the direction vertical to the beam scanning direction, it is possible to form the band-form crystal grain being lined continuously.

21 Claims, 15 Drawing Sheets

U.S. PATENT DOCUMENTS

| | | | |
|---|---|---|---|
| 6,479,837 B1* | 11/2002 | Ogawa et al. | 257/59 |
| 6,503,852 B1* | 1/2003 | Hosono et al. | 430/5 |
| 6,555,422 B1* | 4/2003 | Yamazaki et al. | 438/166 |
| 6,645,830 B2* | 11/2003 | Shimoda et al. | 438/455 |
| 6,692,999 B2 | 2/2004 | Takei et al. | |
| 6,770,545 B2 | 8/2004 | Yang | |
| 6,777,276 B2* | 8/2004 | Crowder et al. | 438/166 |
| 6,809,013 B2 | 10/2004 | Ito | |
| 6,815,269 B2 | 11/2004 | Okumura | |
| 7,033,434 B2* | 4/2006 | Kim | 117/4 |
| 7,087,505 B2* | 8/2006 | Kimura et al. | 438/487 |
| 7,129,124 B2 | 10/2006 | Hongo et al. | |
| 7,192,479 B2* | 3/2007 | Mitani et al. | 117/2 |
| 7,205,184 B2* | 4/2007 | Kim | 438/166 |
| 2001/0001745 A1* | 5/2001 | Im et al. | 438/747 |
| 2001/0045974 A1* | 11/2001 | Shoemaker et al. | 347/63 |
| 2002/0104750 A1* | 8/2002 | Ito | 204/157.15 |
| 2002/0146893 A1* | 10/2002 | Shimoda et al. | 438/458 |
| 2003/0061984 A1* | 4/2003 | Maekawa et al. | 117/4 |
| 2003/0104682 A1* | 6/2003 | Hara et al. | 438/487 |
| 2003/0196589 A1* | 10/2003 | Mitani et al. | 117/84 |
| 2003/0224582 A1* | 12/2003 | Shimoda et al. | 438/458 |
| 2004/0043606 A1* | 3/2004 | Crowder et al. | 438/662 |
| 2004/0127066 A1* | 7/2004 | Jung | 438/778 |
| 2004/0142544 A1* | 7/2004 | Kimura et al. | 438/486 |
| 2004/0142582 A1* | 7/2004 | Crowder et al. | 438/795 |
| 2004/0209199 A1* | 10/2004 | Kishima et al. | 430/320 |
| 2004/0248386 A1* | 12/2004 | Nishitani et al. | 438/478 |
| 2006/0073622 A1* | 4/2006 | Hartzell | 438/22 |
| 2006/0177361 A1* | 8/2006 | Kumomi | 422/245.1 |

FOREIGN PATENT DOCUMENTS

| | | |
|---|---|---|
| CN | 1396317 | 2/2003 |
| CN | 1457103 | 11/2003 |
| CN | 1480780 | 3/2004 |
| JP | 11-64883 | 3/1999 |
| JP | 2000-208769 | 7/2000 |
| JP | 2003-45803 | 2/2003 |
| JP | 2003-100628 | 4/2003 |

* cited by examiner

FIG.1 PRIOR ART
(1)
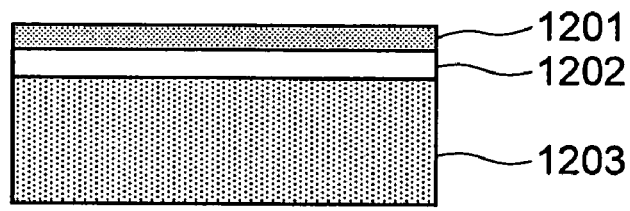
(2)
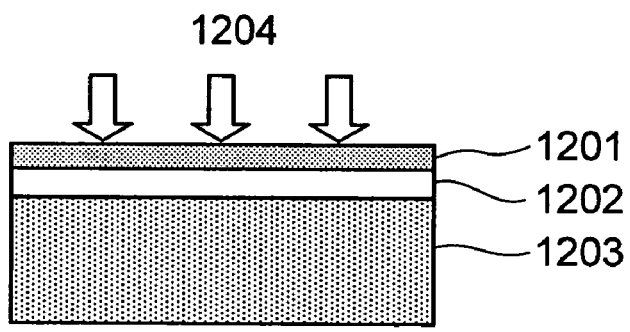
(3)
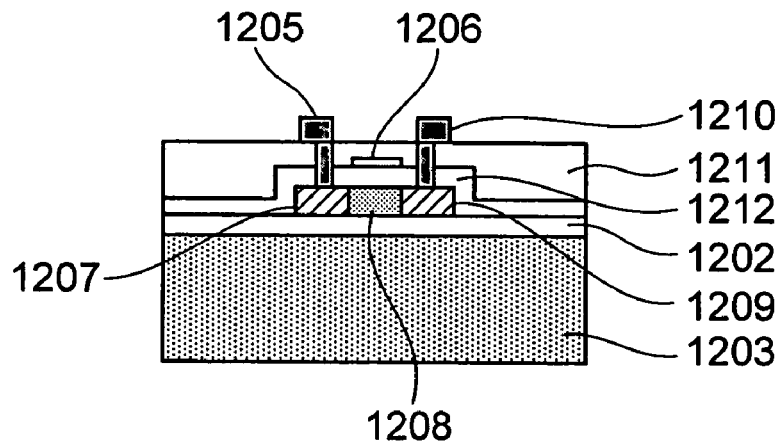

FIG.2 PRIOR ART
(1)
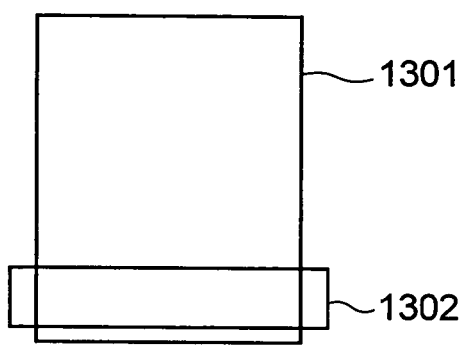
(2)
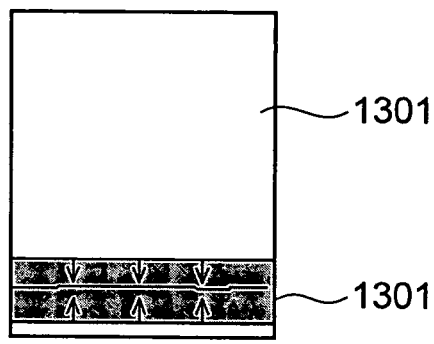
(3)
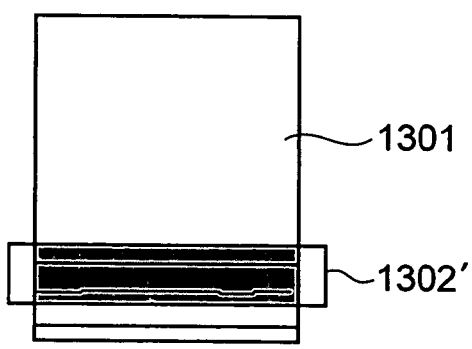
(4)
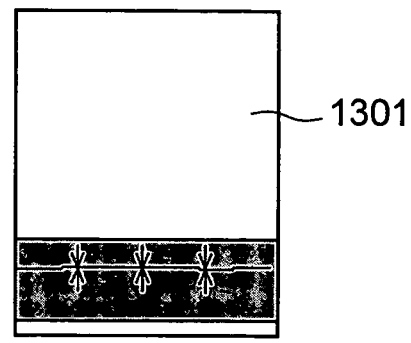
(5)
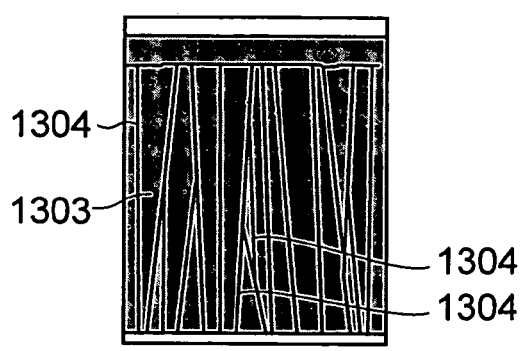

FIG.3 PRIOR ART
(1)
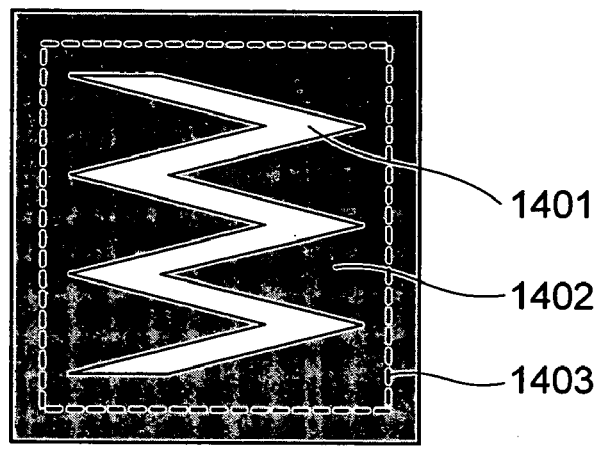
(2)
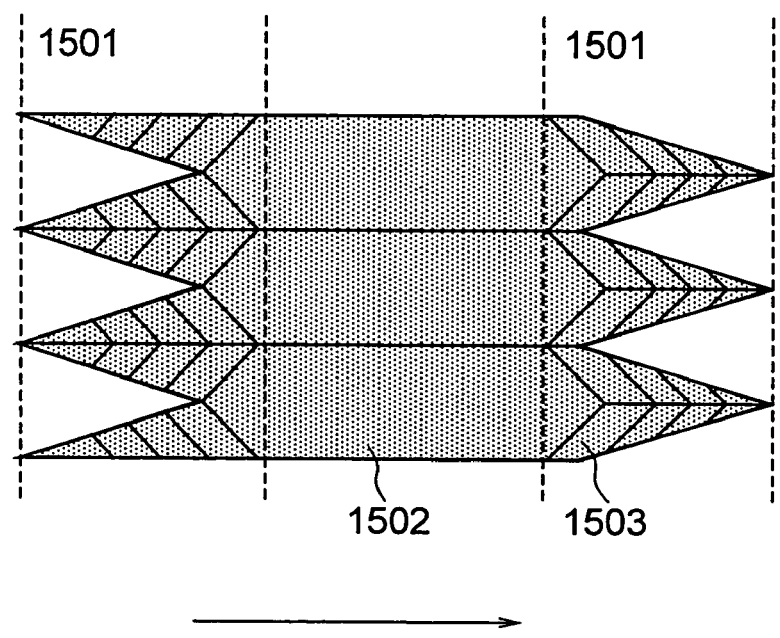

FIG. 6
(1)
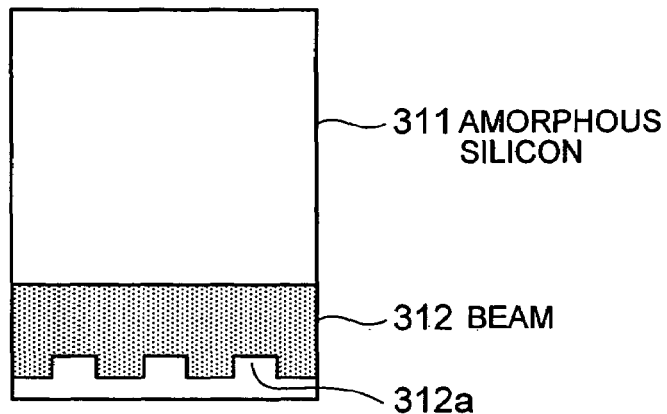
(2)
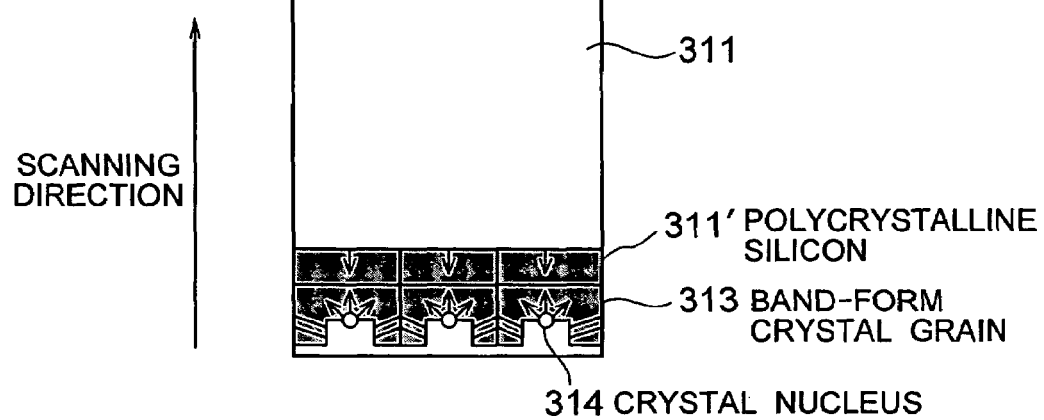
(3)
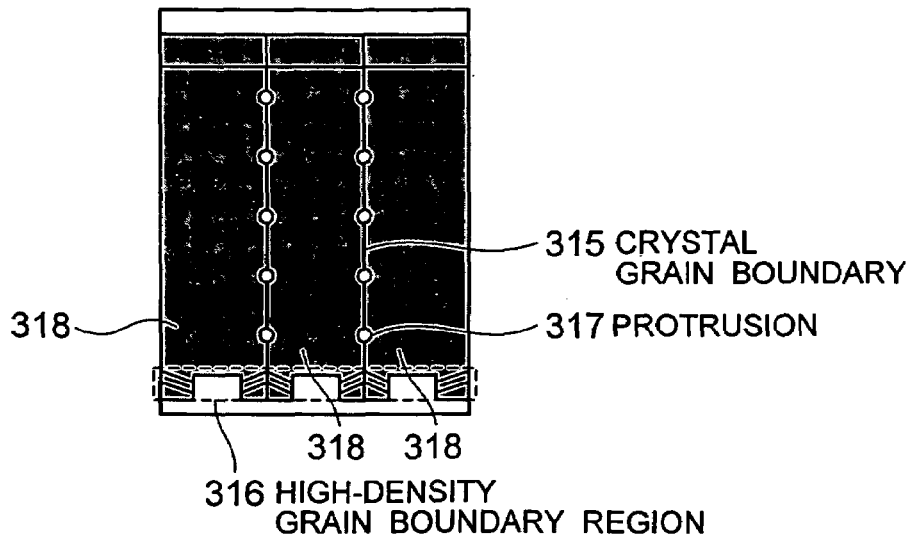

EXAMPLE 1

FIG. 9
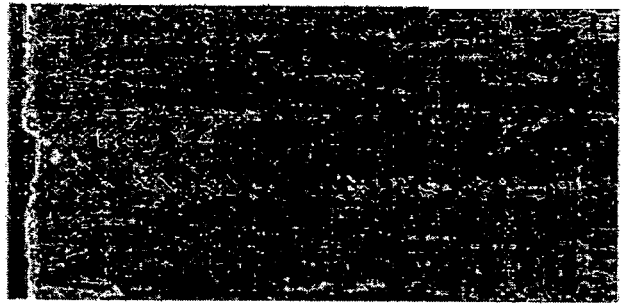
EXAMPLE 2-1 CONCAVE LENGTH 1.5μm
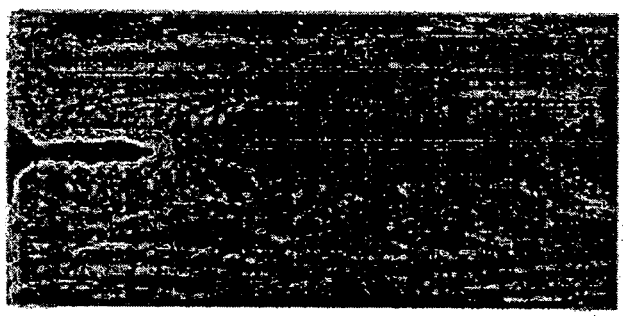
EXAMPLE 2-2 CONCAVE LENGTH 3μm
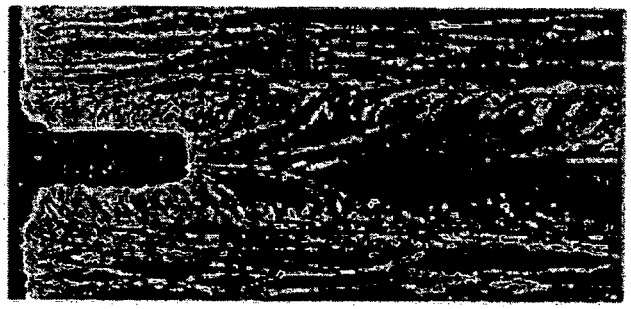
EXAMPLE 2-3 CONCAVE LENGTH 6μm
3μm
EXAMPLE 2-4 CONCAVE LENGTH 12μm

FIG.10
(1)
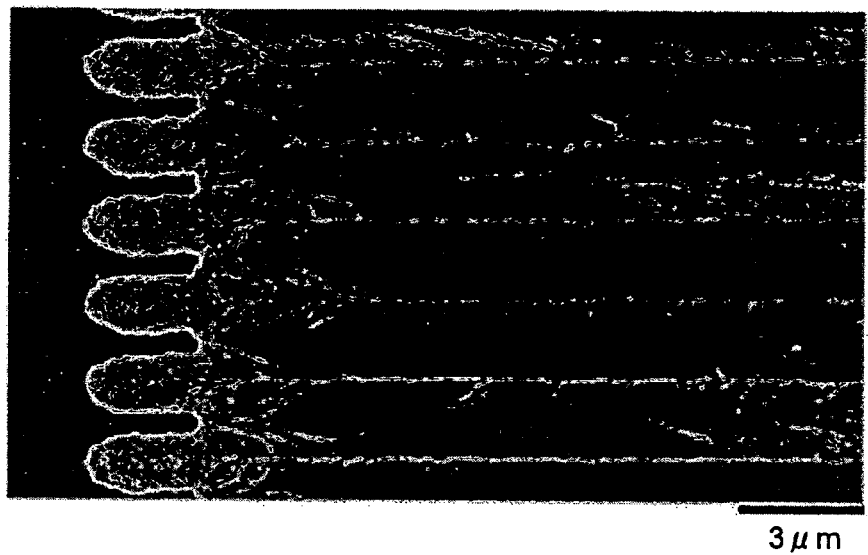
EXAMPLE 3
(2)
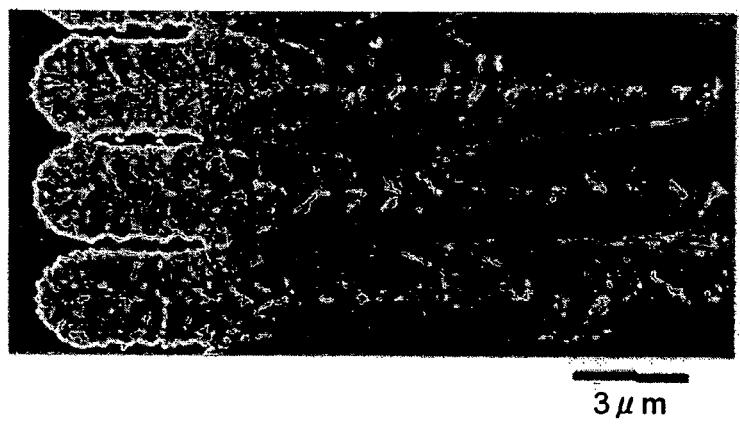
EXAMPLE 4-1 CONVEX LENGTH 6μm
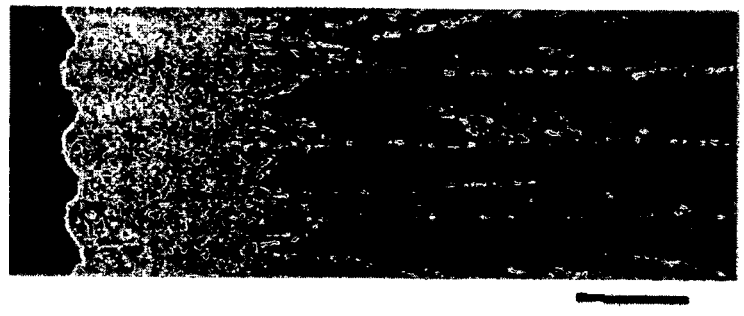
EXAMPLE 4-2 CONVEX LENGTH 3μm

FIG.11
(1)
EXAMPLE 5-1  CONCAVE LENGTH 9μm
3μm
EXAMPLE 5-2  CONCAVE LENGTH 3μm
(2)
EXAMPLE 6

FIG. 12
(1)
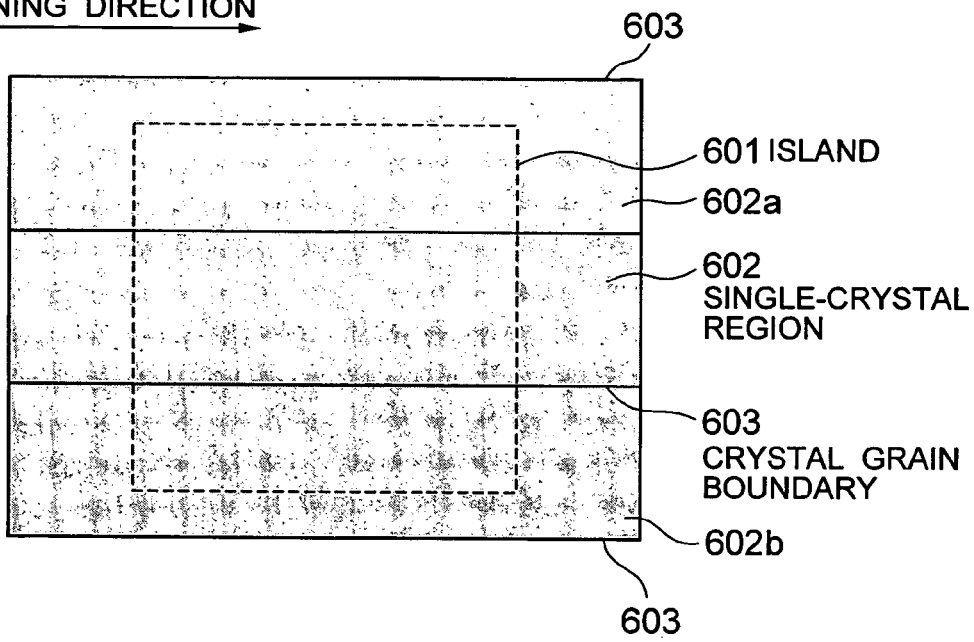
(2)
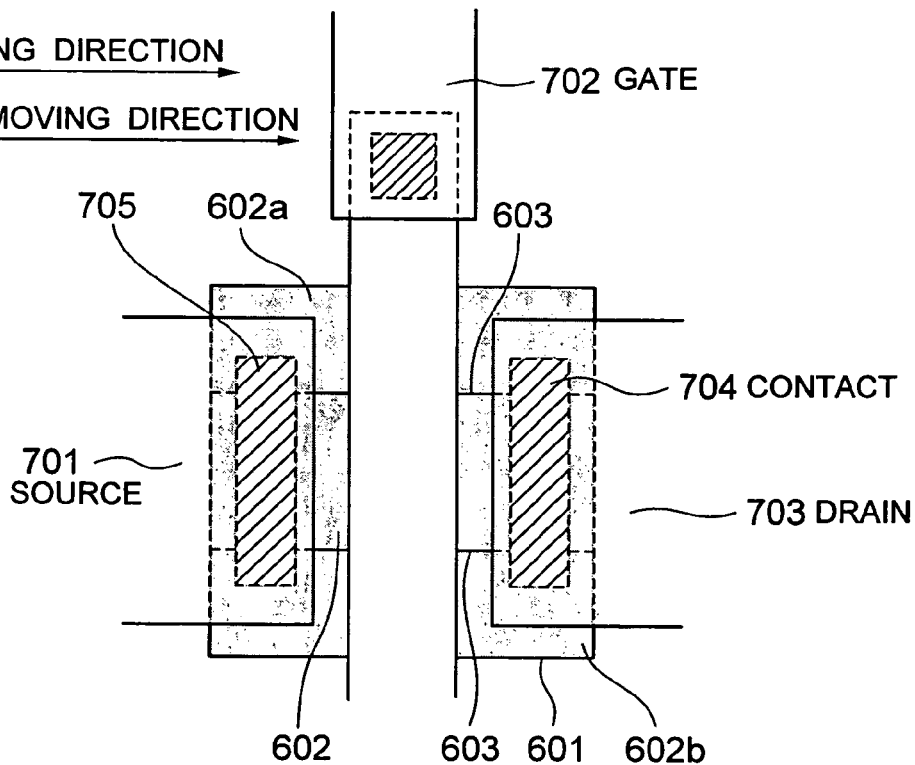

FIG.13
(1)
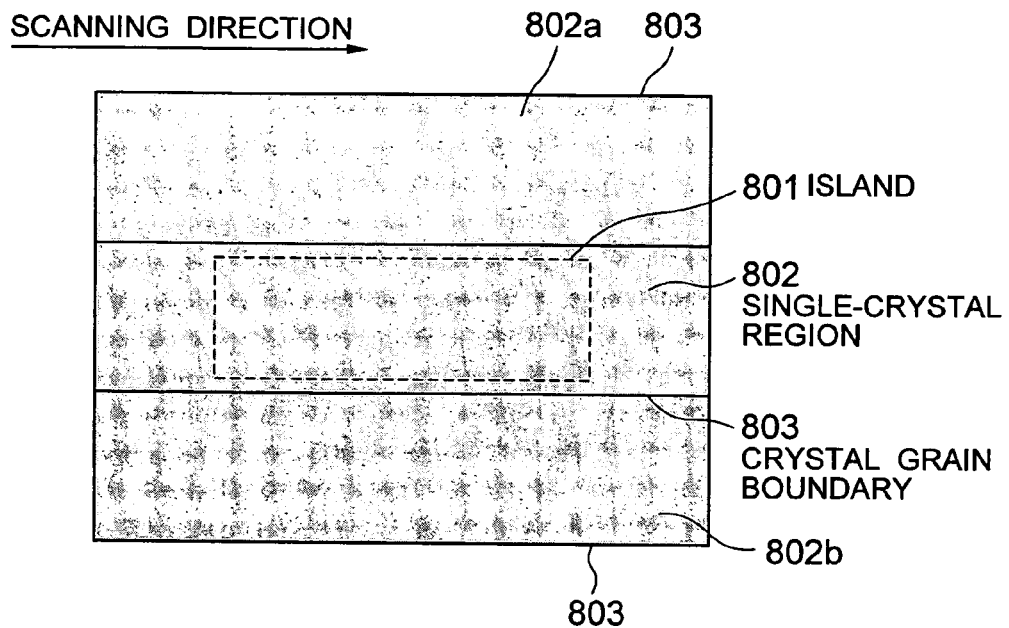
(2)
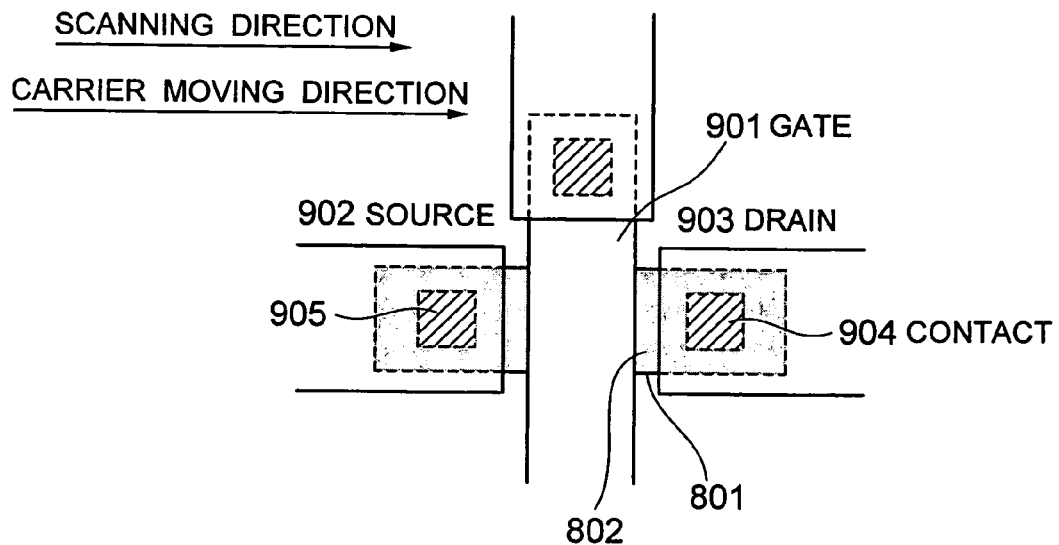

FIG. 14
(1)
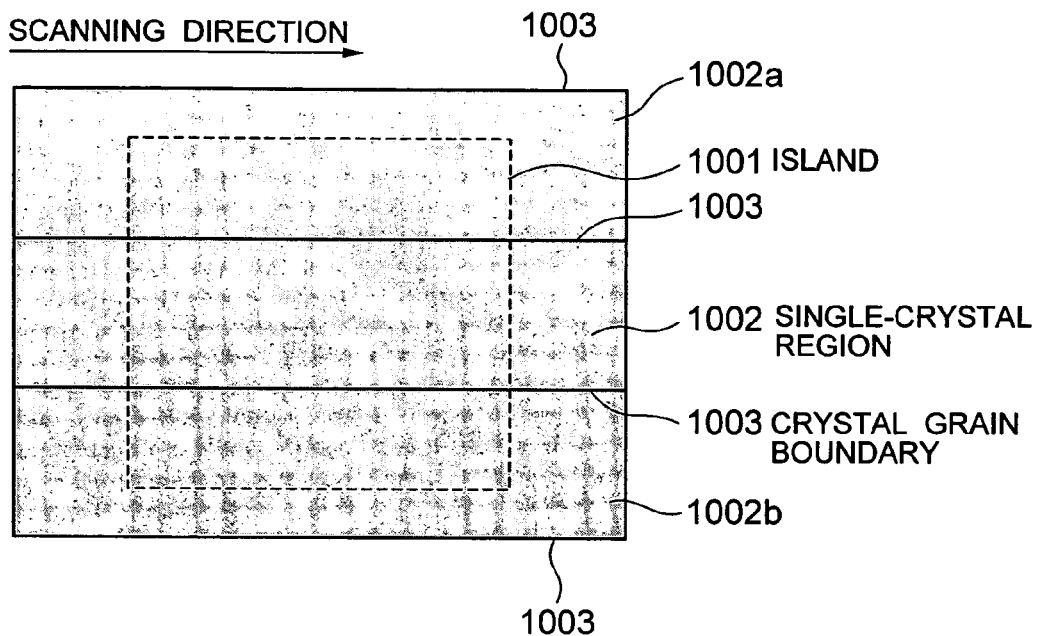
(2)
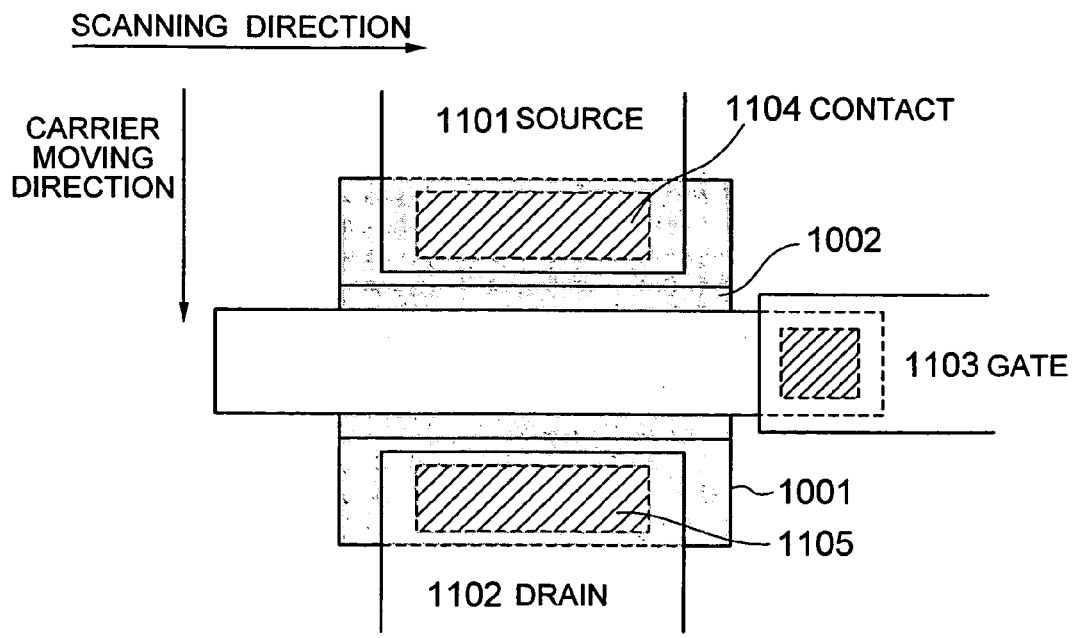

FIG.15
(1)
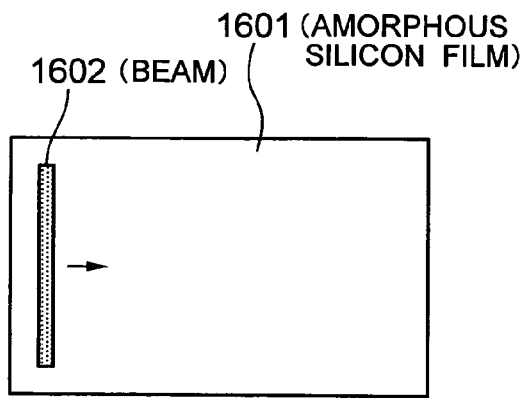
1602 (BEAM) 1601 (AMORPHOUS SILICON FILM)
(2)
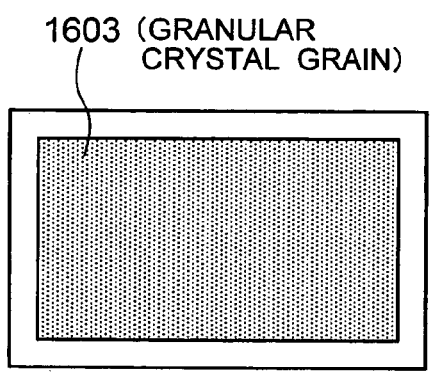
1603 (GRANULAR CRYSTAL GRAIN)
(3)
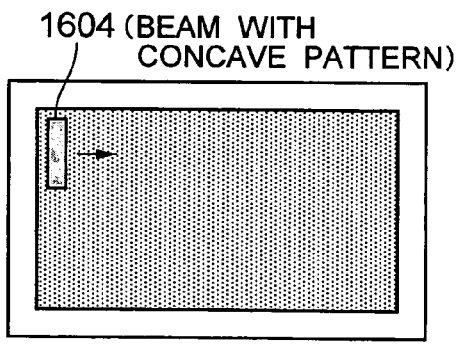
1604 (BEAM WITH CONCAVE PATTERN)
(4)
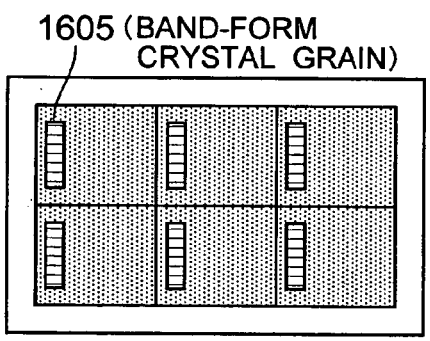
1605 (BAND-FORM CRYSTAL GRAIN)
(5)
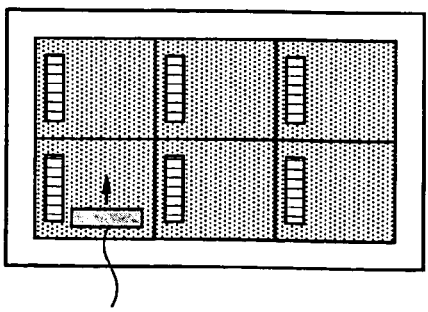
1606 (COMB-LIKE BEAM)
(6)
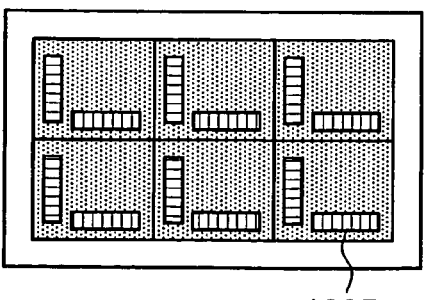
1605 (BAND-FORM CRYSTAL GRAIN)

SEMICONDUCTOR THIN FILM MANUFACTURING METHOD AND DEVICE, BEAM-SHAPING MASK, AND THIN FILM TRANSISTOR

BACKGROUND OF THE INVENTION

1. Field of the Invention

The present invention relates to a method and a device for manufacturing a semiconductor thin film especially with controlled grain boundaries and to a thin film transistor.

2. Description of the Related Art

As a switching device for constituting pixels in a liquid crystal display device, used is a thin film transistor (referred to as a "TFT" hereinafter) formed on a glass substrate. Recently, in addition to achieving highly fine liquid crystal display devices, there has been an increasing demand for improving the action speed of the TFTs in order to achieve a system-on-glass, and a technique for forming a high-quality laser annealed polycrystalline silicon TFT has drawn an attention.

The above-described TFT is manufactured in the manner as shown in FIG. 1. For example, as shown in FIG. 1(1), amorphous silicon 1201 is formed on an insulating film 1202 which is formed on a surface of a glass substrate 1203. Then, as shown in FIG. 1(2), a polycrystalline silicon 1201' is formed by irradiating a laser light 1204 onto the surface of the amorphous silicon 1201. Subsequently, as shown in FIG. 1(3), a source region 1207, a drain region 1209, and a channel (active layer) 1208 sandwiched in between the source region 1207 and the drain region 1209 are formed on the obtained polycrystalline silicon 1201'. A gate insulating film 1212 and a gate electrode 1206 are formed thereon. After forming an interlayer insulating film 1211 by covering the gate electrode 1206 and the gate insulating film 1212, a contact hole going through the interlayer insulating film 1211 and the gate insulating film 1212 is formed. Then, on the interlayer insulating film 1211, a source electrode 1205 connected to the contact hole of the source region 1207 and a drain electrode 1210 connected to the contact hole of the drain region 1209 are formed, respectively. Thereby, the TFT is completed.

Recently, there has been a still increasing demand for a further improvement in the action speed of the polycrystalline TFT. The action becomes faster when the mobility of carrier (electron or hole) within a channel becomes larger. However, when there are a large number of grain boundaries present within the channel, the mobility of the carrier is decreased. Therefore, techniques for improving the mobility of the carrier have been proposed as described below, in which the number of grain boundaries within the channel is decreased by controlling crystal growth at the time of laser annealing.

First Related Art

Disclosed in "Sequential lateral solidification of thin silicon films on SiO2" (Robert S. Sposili and James S. Im, Appl. Phys. Lett 69 (19) 1996 pp. 2864-2866) is a technique for forming huge crystal grains in a direction of scanning by scanning a narrow-line beam. This technique will be described in the followings.

First, as shown in FIG. 2(1), pulse laser light is shaped into a narrow-line beam 1302 by a prescribed mask, and the shaped narrow-line beam 1302 is scanned along a substrate to be irradiated onto amorphous silicon 1301 of the substrate. Thereby, the amorphous silicon 1301 is heated (annealed) in order.

As shown in FIG. 2(2), by the first irradiation of the narrow-line beam 1302, crystallization of the dissolved amorphous silicon film proceeds as follows. First, each crystal grows towards the center of the dissolved region with the end portion of the narrow-line scanning direction (the beam width direction), which is an interface of solid and liquid phases between with the adjacent undissolved region, being the start point. As a result, the solidified portion becomes the crystallized polycrystalline silicon 1301'. Further, each crystal collides in the center area and the vicinity and the growth is interrupted, thereby forming the crystal grain boundaries in these areas. In the direction (beam length direction) vertical to the scanning direction, a large number of crystal grain boundaries are generated along with the scanning direction.

Subsequently, as shown in FIG. 2(3), performed is the second irradiation of the narrow-line beam 1302'. The scanning amount of the second narrow-line beam 1302' is equal or smaller than the grain size of the crystal grain crystallized along the scanning direction of the first narrow-line beam 1302.

Then, as shown in FIG. 2(4), in accordance with the irradiation of the second narrow-line beam 1302', crystal growth is carried out using the crystal grains grown by the first irradiation as a seed.

By repeating the dissolving and crystallization of the amorphous silicon 1301 by scanning the laser irradiation region in order, a crystal grain 1303 extending along the scanning direction can be formed as shown in FIG. 2(5).

Second Related Art

Japanese Patent Unexamined Publication No. 11-64883 discloses a technique for scanning and irradiating by shaping a light beam into a zigzag beam shape by letting the beam pass through a transmission section 1401 using a shielding mask which comprises a shielding section 1402 and the transmission section 1401 in a zigzag pattern shown in FIG. 3(1). In this technique, not only the growth in the scanning direction but also the crystal growth in the direction vertical to the scanning direction is performed with the peak of the beam pattern being the start point. As a result, as shown in FIG. 3(2), it has been reported that it is possible to form a crystal grain 1502 in which the positioning is controlled in accordance with the cycle of the zigzag pattern. In FIG. 3(2), a reference numeral 1501 is a high-density grain boundary region and 1503 is a crystal grain boundary.

In the case of laser annealing as described in the first related art, it is possible to extend the crystal grains in the scanning direction of the laser light (in the beam width direction). However, there is no temperature gradient in the direction (the beam length direction) orthogonal to the scanning direction of the laser light so that the crystal grain boundaries are generated at random in the beam length direction. Therefore, there may cause such shortcomings that the growth of the crystal grains are interrupted and that the grain+in the beam length direction becomes as short as 1 μm. As a result, when TFTs are manufactured by providing channels so that the carriers move in parallel to the scanning direction, there are crystal grain boundaries generated in the channels since the positions of the crystal grain boundaries are not controlled. Thus, the mobility of carrier is deteriorated and fluctuations in the mobility and threshold voltage are increased. Further, when the TFTs are manufactured by providing the channels so that the carriers move in the direction vertical to the scanning direction, there are crystal grain boundaries generated in the channels by interrupting the transition of the carriers since the positions of the crystal grain boundaries are not controlled. Thus, the mobility of carrier is deteriorated and fluctuations in the mobility and threshold voltage are increased.

Further, protrusions are generated along the crystal grain boundaries in each scanning step. Since the crystal grain boundaries in the beam width direction are formed at random, positioning of the protrusions in the beam width direction becomes random. In the TFT including the protrusions within the channel, the electric fields at the time of action are concentrated in the protrusions, thereby causing the fluctuation of the threshold voltage. That is, the dispersion in the threshold voltage becomes large in the TFT manufactured in the first related art, in which the positioning and the number of the protrusions within the channel become random.

In the laser annealing using a shielding mask as described in the second related art, the beam shape on the shielding mask in general is in a rectangular shape (a laser irradiation region 1403) as shown in FIG. 3(1). Thus, when the laser is let through the mask in the zigzag pattern, the transmittivity of the laser light is decreased compared to the case of the first related art where the narrow-line beam is formed. As a result, the beam length irradiated onto the substrate becomes shorter and the polycrystalline region attained in one-time scanning irradiation becomes narrower. Therefore, the time required for processing the substrate is extended.

Further, in the obtained crystal, a high-density grain boundary region 1501 as shown in FIG. 3(2) is generated in a wide range in the start position and the end position of the irradiation. Also, in a step of manufacturing the mask, forming a complicated zigzag pattern increases the cost compared to the case of forming a straight-line pattern. In addition, an optical system with high resolution becomes essential to a laser annealing device in order to form the zigzag pattern beam.

SUMMARY OF THE INVENTION

An object of the present invention is to provide a semiconductor thin film manufacturing method which enables to control the positions of the crystal grain boundaries formed on a semiconductor thin film at the time of forming a crystal film, a beam shaping mask used for the semiconductor thin film manufacturing method, a semiconductor thin film manufacturing device which manufactures a semiconductor thin film using the beam shaping mask, and a thin film transistor manufactured by the manufacturing device.

In order to achieve the foregoing objects, the manufacturing method of a semiconductor thin film for growing a crystal grain on a semiconductor thin film by irradiating a laser beam onto the semiconductor thin film formed on an insulating substrate, the method comprising a step of shaping a laser beam, wherein in the step of shaping a laser beam, a part of an irradiation pattern of the laser beam to be irradiated onto the semiconductor thin film is shaped into a control pattern.

With the present invention, the temperature gradient is generated on the semiconductor thin film due to the control pattern which is shaped in a part of the irradiation pattern. Due to the temperature gradient, the crystal film is to be continuously formed on the semiconductor thin film. Thus, the position control of the crystal grain boundaries can be surely performed so that it enables to obtain the crystal film with a sufficient area for forming the active layer.

The irradiation pattern is shaped into a shape which is a rectangle and also has the control pattern in a side of the rectangle. The band-form crystal grain is grown on the semiconductor thin film while performing the position control of the crystal grain boundaries by the control pattern. Thereby, the growth of the band-form crystal grain is not interrupted and the position control of the crystal grain boundaries can be performed.

The present invention is not limited to the case where the crystal film is formed on the semiconductor thin film by a single shot in which the laser beam is not scanned. In the case of scanning the laser beam, a band-form crystal region made with the band-form crystal grains is formed in a region sandwiched in between parallel crystal grain boundaries by irradiating the laser beam of the irradiation pattern including the control pattern onto the semiconductor thin film while scanning the laser beam. In this case, the control pattern is formed in a side opposite to a side on a scanning direction side of the laser beam for shaping the laser beam.

In the case of scanning the laser beam as described, the band-form crystal grain is to be grown with the temperature gradient given to the semiconductor thin film as well. Therefore, it enables to expand the region of the crystal film for forming the active layer (channel) by performing the position control of the crystal grain boundaries. Further, the transmittivity of the laser light is larger compared to the case of the zigzag pattern so that the beam length can be extended and the one-time scanning irradiation region can be widened. Thereby, the time required for the laser annealing processing per substrate can be shortened. Further, by shortening the beam concave width in the concave pattern, the high-density grain boundary region generated in the irradiation start position can be narrowed compared to the case of the zigzag pattern. Furthermore, since the front-half end of the beam is a straight line towards the direction vertical to the scanning direction, the high-density grain boundary region generated in the irradiation end position becomes about the crystal growth distance of the one-time irradiation. Thus, it becomes narrower than the case of the zigzag pattern. The high-density region generated in the irradiation end position in the case of zigzag pattern becomes about the sum of the scanning direction length of the zigzag pattern and the crystal growth distance of the one-time irradiation. Further, by shaping the control pattern to be in a concave shape, it becomes the pattern with no acute angle. Therefore, compared to the case of zigzag pattern, the manufacturing cost can be decreased and high resolution is not required as much for the optical system of the laser annealing device. Moreover, the TFT manufactured using the obtained semiconductor thin film enables to improve the carrier mobility and to suppress the dispersions in the mobility and the threshold voltage.

A beam concave length in a length direction of the control pattern is set to be equal or less than a beam concave width in a width direction of the control pattern where a crystal growth width of the band-form crystal grain becomes the maximum. A beam concave width in a width direction of the control pattern is set to be equal or more than a beam concave width in a width direction of the control pattern where a crystal growth width of the band-form crystal grain becomes the maximum.

Thereby, it is possible to expand the area of the crystal film for forming the active layer by performing the position control of the crystal grain boundaries which are formed with the beam concave part being the start position. Further, it is possible to form the band-form crystal region with the decreased number of the grain boundaries being lined continuously.

At least one or more of the control pattern is shaped in the one side of the rectangle. A cycle of shaping the control pattern is set to be equal or less than a length which is substantially the same as the crystal growth width of the band-form crystal grain. As described, depending on the positioning of the control patterns, the position control of the crystal grain boundaries can be surely performed.

In order to surely perform the position control of the crystal grain boundaries, it is desirable to form a mask in the following configuration. That is, the beam shaping mask according to the present invention is a beam shaping mask for shaping a laser beam, wherein a main body of the mask has a shielding pattern, which shields the laser beam, in a part of a transmission region for transmitting the laser beam.

In this case, the transmission region is formed in a shape which is a rectangle and also is in a shape with an opening having the shielding pattern in a side of the rectangle. The shielding pattern may be formed in a convex pattern which projects from a shielding region of the laser beam towards the transmission region. Further, a concave length in a length direction of the shielding pattern is set to be equal or less than a concave width of the shielding pattern where a crystal growth width of a band-form crystal grain becomes the maximum. A concave width in a width direction of the shielding pattern is set to be equal or larger than a concave width of the shielding pattern where a crystal growth width of a band-form crystal grain becomes the maximum. In this case, one or more of the shielding pattern is provided. The shielding pattern may be provided periodically. It is desirable that the cycle of the shielding pattern be set to be equal or less than a length which is substantially the same as the crystal growth width of the band-form crystal grain.

Provided that an opening width in a width direction of the transmission region is A, a concave width in a width direction of the shielding pattern is B, and the maximum crystal growth distance of the band-form crystal grain in the width direction is L, their dimensional relation may be set to be $2L \leq A-B$. In this case, when it is set to be $2L > A-B$, the crystal growth in a side on the control pattern side is interrupted by the crystal growth generated from the opposite side so that the growth width of the single crystal film in the width direction of the transmission region becomes narrow. On the contrary, by setting it to be $2L \leq A-B$, the crystal growth from the control pattern side is not to be interrupted by the crystal growth from the opposite side so that the growth width of the single crystal film in the width direction of the transmission region can be widened.

Provided that a concave length in a length direction of the shielding pattern is C, a convex length which is a space in between the shielding patterns is D, and the maximum crystal growth distance of the band-form crystal grain in the width direction of the transmission region is L, their dimensional relation may be set to be $2L \geq C+D$. In this case, when it is set to be $2L < C+D$, a large number of crystal grain boundaries are generated in between the crystal grains which form the band-form single crystal film. On the contrary, by setting the relation to be $2L \geq C+D$, the temperature gradient is formed radially with the control pattern being the center so that the band-form crystal grains can be formed in line.

Provided that an opening width in a width direction of the transmission region is A, a concave width in a width direction of the shielding pattern is B, a concave length in a length direction of the shielding pattern is C, and a convex length which is a space in between the shielding patterns is D, their dimensional relation may be set to be $A-B \geq C+D$. With this setting, both effects achieved by setting $2L \geq A-B$ and $2L \geq C+D$ can be obtained. Therefore, the area of the crystal film can be widened in the length direction and the width direction of the laser beam.

The semiconductor thin film manufacturing device according to the present invention is a semiconductor thin film manufacturing device for growing a crystal grains of a single crystal on a precursor film by irradiating a laser beam onto the precursor film made by a semiconductor thin film formed on an insulating substrate, the device comprising a beam shaping mask for shaping a laser beam, wherein a main body of the mask has a shielding pattern, which shields the laser beam, in a part of a transmission region for transmitting the laser beam.

With the present invention, the band-form crystal region which extends in the length direction of the crystal grain region can be formed in the region sandwiched by the parallel crystal grain boundaries by controlling the forming positions of the crystal grain boundaries.

A thin film transistor using the semiconductor thin film according to the present invention is a thin film transistor with an active layer in which carriers are mobilized, the thin film transistor comprising a band-form crystal region which is formed in a region sandwiched in between parallel crystal grain boundaries, wherein at least either a first active layer in which a moving direction of the carriers is set in a length direction of the crystal grain boundaries or a second active layer in which a moving direction of the carriers is set in a direction crossing with the crystal grain boundaries is formed in the band-form crystal region.

When the first active layer is provided, the first active layer is formed in the band-shape crystal region sandwiched between the parallel crystal grain boundaries, and a drain region and a source region are formed along a length direction of the crystal grain boundaries by sandwiching the active layer. When the second active layer is provided, the second active layer is formed in the band-shape crystal region sandwiched between the parallel crystal grain boundaries, and a drain region and a source region are formed along a direction crossing with a length direction of the crystal grain boundaries by sandwiching the active layer. Further, when the first active layer and the second active layer are provided, the first active layer and the second active layer are respectively formed in the band-shape crystal region sandwiched between the parallel crystal grain boundaries; the drain region and the source region of the first active layer are formed along a direction crossing with a length direction of the crystal grain boundaries by sandwiching the active layer; and the drain region and the source region of the second active layer are formed along a direction crossing with the length direction of the crystal grain boundaries by sandwiching the active layer.

The drain region and the source region of the first active layer are formed by including the crystal grain boundaries and the band-form crystal region. The drain region and the source region of the first active layer are formed only within the band-form crystal region. Further, the drain region and the source region of the second active layer are formed by including the crystal grain boundaries and the band-form crystal region. Furthermore, protrusions are scattered only in the crystal grain boundaries.

A thin film transistor according to the present invention may have a configuration, comprising: a semiconductor thin film made with granular crystal grains; and a band-form crystal grain formed along one direction of the semiconductor thin film, which is made with crystal grains with a larger grain diameter than that of the granular crystal grains, wherein an active layer is formed in the semiconductor thin film and the band-form crystal grain, respectively.

With the present invention, it enables to achieve high-mobility of carrier and high ion current since the crystal grain boundaries are not contained in the active layer.

With the manufacturing method and the manufacturing device according to the present invention, it enables to decrease the number of the crystal grain boundaries in the semiconductor thin film and also to manufacture the semiconductor thin film in which the directions of the crystal grain boundaries are controlled. Further, the transmittivity of the laser light is larger compared to the case of the zigzag pattern so that the beam length can be extended and the one-time scanning irradiation region can be widened. Thereby, the time required for the laser annealing processing per substrate can be shortened. Further, by shortening the convex width of the beam in the concave pattern, the high-density grain boundary region generated in the irradiation start position can be narrowed compared to the case of the zigzag pattern. Furthermore, since the front-half end of the beam is a straight line towards the direction vertical to the scanning direction, the high-density grain boundary region generated in the irradiation end position becomes about the crystal growth distance achieved by one-time irradiation. Thus, it becomes narrower than the case of the zigzag pattern. Also, the step for manufacturing the mask for the concave pattern is easier compared to the case of the zigzag pattern and the manufacturing cost can be decreased. Furthermore, it does not require the high resolution as much in the optical system of the laser annealing device when forming the concave-pattern beam shape compared to the case of forming the zigzag-pattern beam shape. Moreover, the TFT manufactured using the obtained semiconductor thin film enables to improve the carrier mobility and to suppress the dispersions in the mobility and the threshold voltage.

Further, another object is to shorten the laser annealing processing time, to narrow the high-density grain boundary region generated in the start position and the end position of the irradiation, to decrease the cost for manufacturing the mask, and to achieve the low resolution of the optical system in the laser annealing device by improving the transmittivity of the optical system compared to the case of zigzag pattern. Still another object of the present invention is to improve the action speed of the TFTs manufactured using the obtained semiconductor thin film so as to suppress the dispersions in the action speeds and in the threshold voltages.

BRIEF DESCRIPTION OF THE DRAWINGS

FIG. 1 are cross sections for showing a manufacturing step of a conventional TFT, in which the step proceeds in order from FIG. 1(1)-FIG. 1(3);

FIG. 2 are plan views for showing the steps of laser annealing of a first related art, in which the steps proceeds in order from FIG. 2(1)-FIG. 2(5);

FIG. 3(1) is a plan view for showing a mask of a second related art and FIG. 3(2) is a model illustration of a polycrystalline film surface of the second related art;

FIG. 6 are plan views for showing the steps of laser annealing according to the present invention, in which the steps proceeds in order from FIG. 6(1)-FIG. 6(3);

FIG. 9 is an illustration for showing an SEM image of the polycrystalline film surface formed in EXAMPLE 2;

FIG. 10(1) is an illustration for showing an SEM image of the polycrystalline film surface formed in EXAMPLE 3, and FIG. 10(2) is an illustration for showing an SEM image of the polycrystalline film surface formed in EXAMPLE 4;

FIG. 11(1) is an illustration for showing an SEM image of the polycrystalline film surface formed in EXAMPLE 5, and FIG. 11(2) is an illustration for showing an SEM image of the polycrystalline film surface formed in EXAMPLE 6;

FIG. 12(1) is a model illustration of the polycrystalline film surface formed in EXAMPLE 7, and FIG. 12(2) is a model illustration for showing the TFT of EXAMPLE 7;

FIG. 13(1) is a model illustration of the polycrystalline film surface formed in EXAMPLE 8, and FIG. 13(2) is an illustration for showing the TFT of EXAMPLE 8;

FIG. 14(1) is a model illustration of the polycrystalline film surface formed in EXAMPLE 9, and FIG. 14(2) is an illustration for showing the TFT of EXAMPLE 9; and FIG. 15 is a plan view for showing EXAMPLE 10, in which the step proceeds in order form FIG. 15(1)-FIG. 15(6).

DESCRIPTION OF THE PREFERRED EMBODIMENTS

Figure 4:
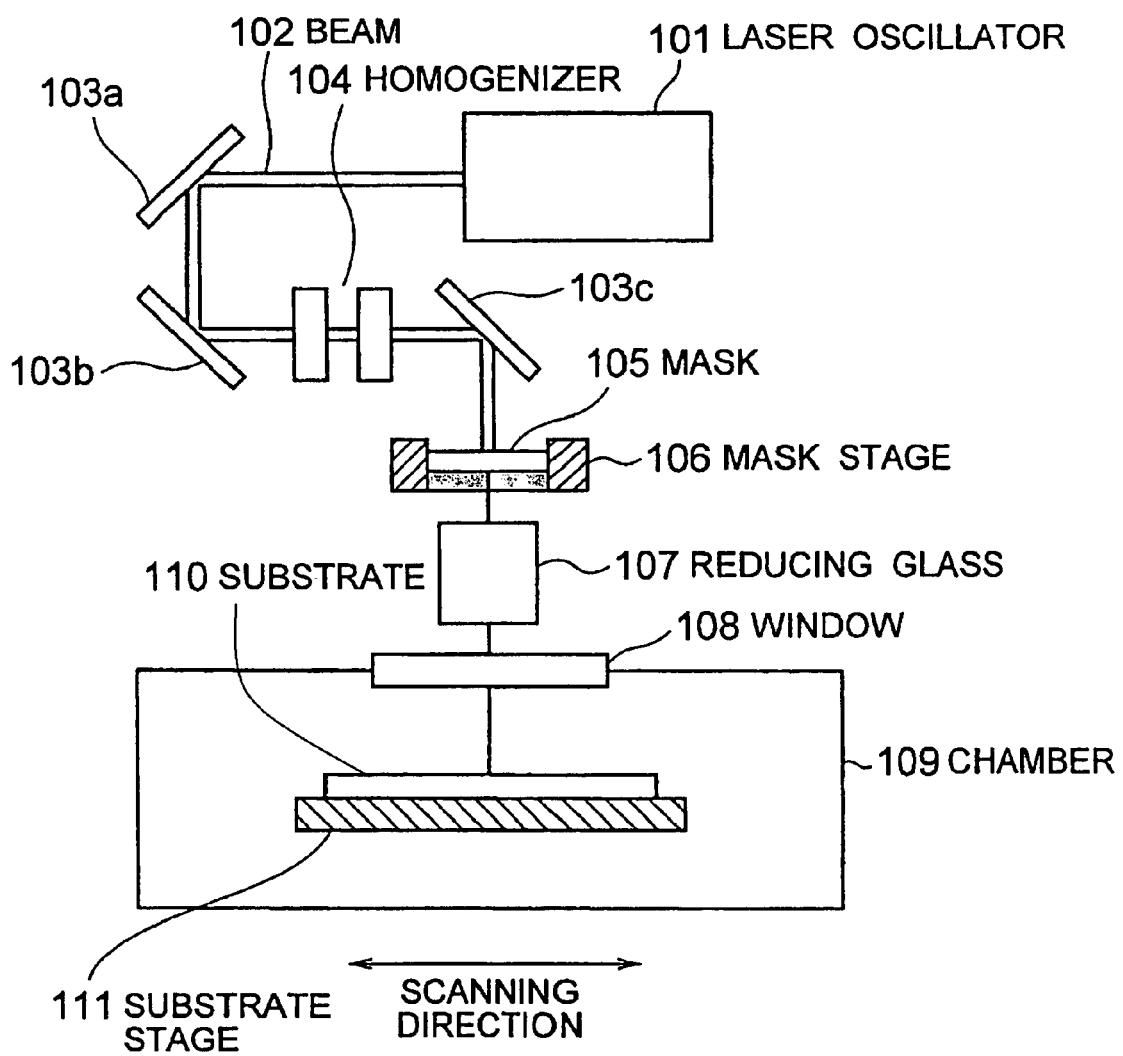
FIG. 4 is an illustration for showing a laser annealing device according to the present invention.

Preferred embodiments of the present invention will be described hereinafter by referring to accompanying drawings. Laser annealing is performed using a laser annealing device shown in FIG. 4. In the drawing, a precursor to be described later is formed on a substrate 110, and the substrate 110 is placed on a substrate stage 111 inside a chamber 109. Outside of the chamber 109, a laser oscillator 101 is disposed. The laser oscillator 101 outputs XeCl excimer laser light (beam 102) with the wavelength of 308 nm by oscillating it in a pulse form. The laser light (beam 102) is directed to a homogenizer 104 by mirrors 103a, 103b and is shaped into a rectangular beam profile by the homogenizer 104. The optical path of the shaped beam 102 is bent downwards by a mirror 103c so that it passes through a mask 105 on a mask stage 106 to be in the beam shape for being irradiated onto the precursor on the substrate 110. Further, the beam (laser light) 102 is reduced by the reducing lens 107 as necessary and irradiated onto the surface of the precursor on the substrate 110 through a window 108 provided to the chamber 109. The substrate 110 can be moved along with the substrate stage 111 in the direction of an arrow in FIG. 4 (that is, in the direction crossing with the beam 102). By the relative movements of the beam 102 and the substrate 110, the beam 102 scans the surface of the substrate 110 in the moving direction of the substrate 110. In the device of the embodiment, scanning by the beam 102 is performed onto the surface of the substrate 110 by relatively moving the beam 102 and the substrate 110 by the substrate stage 111. However, it is not limited to this. Scanning may be performed on a fixed substrate 110 by moving the mask stage 106 in the horizontal direction.

The above-described mask 105 comprises a transmission region made of quartz for transmitting the laser light and a non-transmission region for shielding the laser light by being formed on the surface of the quartz using chrome. It is also possible to form the non-transmission region by forming a film made of a material which shields the laser light, e.g., aluminum, molybdenum, chrome, tungsten silicide, or a stainless alloy on a material which transmits the laser light, and then patterning the formed shielding material film into a required shape. Further, it may be formed by laminating a transparent film such as a chromium oxide film to be a protection film on the shielding film where openings for transmitting the laser light are formed, so as to cover the openings by the transparent film. A single-layered or a multi-layered dielectric film may be patterned to be used as the shielding film. Also, instead of the shielding mask, a phase shift mask may be used for shaping the shape of the beam 102. The above-described mask may be disposed in any positions on the optical path from the laser oscillator 101 to the precursor.

Further, although the XeCl excimer laser is used as the laser oscillator 101 in the above-described embodiment, it is not limited to this. The laser oscillator 101 may be other excimer laser such as a KrF laser, or a solid state laser such as Nd:YAG laser, Nd:YLF laser, Nd:YV04 laser, or a gas laser such as carbon oxide gas laser, argon gas laser.

As for the substrate 110, an insulating film and an amorphous silicon film are formed on the glass substrate in order.

Figure 5:
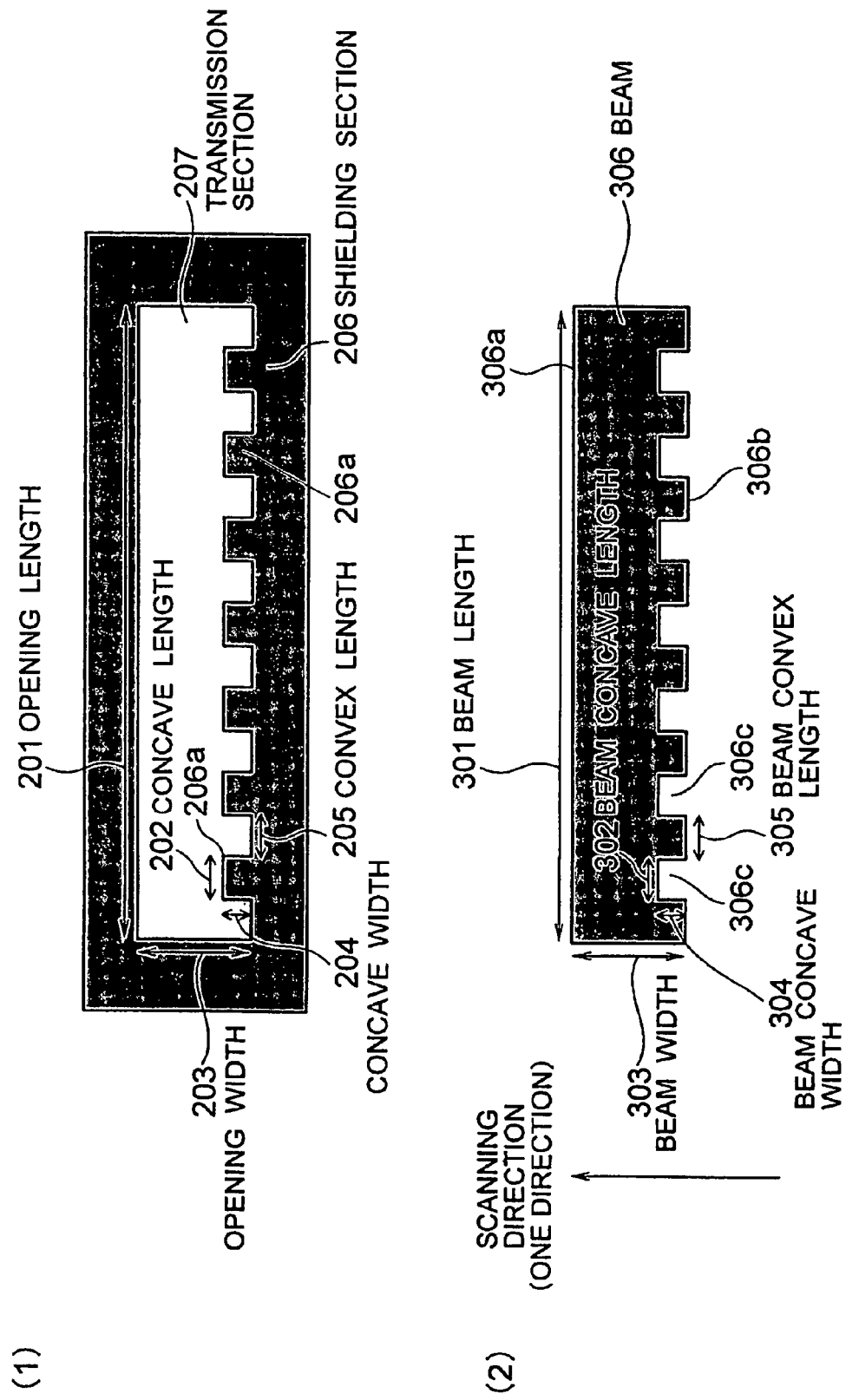
FIG. 5(1) is a plan view for showing a first example of the mask according to the present invention and FIG. 5(2) is a plan view for showing the beam shape.

In the present invention, scanning irradiation is performed by using the mask in a shape as shown in FIG. 5(1), in which the convex shielding pattern and the concave pattern are periodically formed. That is, as shown in FIG. 5(1), a rectangular transmission section 207 having an opening length 201 and an opening width 203 is formed on the shielding film 206. Further, the shielding film 206 comprises a convex shielding pattern 206a in a comb-like shape which projects towards the inside the transmission section 207. The convex shielding pattern 206a is in a rectangular shape which is formed in a convex shape with a concave width 204 and a concave length 202. The convex shielding patterns 206a are formed in line in the length direction of the opening length 201 with the space of the convex length 205 in between and the concave pattern is formed in between the convex shielding patterns 206a. As shown in FIG. 5(2), a beam 306 transmitted through the shielding film 206 shown in FIG. 5(1) is shaped into a rectangular shape having a plurality of concave patterns 306c being formed on a side 306b which is on the opposite side of a side 306a on the scanning direction (one direction) side, with the beam length 301 and the beam width 303. The concave pattern 306c has a beam convex length 305 and a beam width 303, and each of the concave patterns 306c is arranged in line in the side 306b with a space of the beam concave length 302 in between. In FIG. 5(2), the scanning direction of the beam is shown by an arrow.

In FIG. 6(1), amorphous silicon is used for the precursor film which is formed by a semiconductor thin film formed on an insulating substrate. As shown in FIG. 6(1), by irradiating a beam 312 (corresponds to the beam 306 in FIG. 5(2)) to the amorphous silicon 311 for the first time, the temperature gradient is formed radially with the tip of the concave pattern 312a (corresponds to the concave pattern 306c in FIG. 5(2)) of the beam 312 being the center in the region of the amorphous silicon 311 to which the beam 312 is irradiated. Thus, as shown in FIG. 6(2), in the region of the amorphous silicon 311 corresponding to the tip of the concave pattern 312a, formed are crystal grains 313 which grow not only in the beam width direction (the direction of the beam width 303 in FIG. 5(2)) but also in the beam length direction (the direction of the beam length 301 in FIG. 5(2)). By irradiating the beam 312 for the second time and on, with a crystalline nucleus 314 formed on the amorphous silicon 311 by corresponding to the tip of the concave pattern 312a being the seeds, the crystal grain 313 is repeatedly grown. As a result, the crystal grain 313 in a band form with a wider width than that of the grains obtained by the conventional narrow-line beam is formed on the amorphous silicon with the tip of the concave pattern 312a being the start point.

Further, by setting the size of the concave pattern 312a having the beam concave width 304 and the beam concave length 302 to have an area which is equal or smaller than the crystal grain diameter in the scanning direction of the beam and in the direction (vertical direction) crossing with the scanning direction, the band-form crystal grain 313 can be formed continuously in line in the direction crossing with the beam scanning direction. At this time, it is not necessary to set the beam convex length 305 which is the length between the adjacent concave patterns 312a to be equal, but the concave patterns 312a may be appropriately disposed so as to form the band-form crystal grain 313 in desired positions. In the embodiment as described above, as shown in FIG. 6(3), it is possible to decrease the number of the crystal grain boundaries in the semiconductor thin film and also to manufacture the semiconductor thin film in which the forming direction of the crystal grain boundaries 315 is controlled to be in a parallel positional relation. Therefore, the shortcomings of the conventional narrow-line beam can be overcome.

Further, as shown in FIG. 6(3), dot-form protrusions 317 are formed along the crystal grain boundaries 315 at intervals of the scanning step of the beam. Therefore, in the embodiment, obtained is a semiconductor thin film in which the protrusions 317 are formed in a check pattern. In the case where such TFT is formed on the semiconductor thin film, the positioning and the number of the protrusions 317 within the channel can be controlled. Thus, compared to the TFT manufactured by the conventional narrow-line beam with the random positioning and the number of the protrusions within the channel, the dispersion in the threshold voltage becomes smaller. Also, through forming the channels by avoiding the protrusions 317, the dispersion in the threshold voltage can be further suppressed. In FIG. 6(3), three band-form crystal regions 318 divided by the crystal grain boundaries 315 are formed along the length direction of the parallel crystal grain boundaries 315. However, the band-form crystal regions 318 are not limited to be in three lines. Each of the band-form crystal regions 318 is formed by the single crystal.

Further, since the transmittivity of the laser light is larger than that of the zigzag pattern, the beam length can be extended. Thus, the scanning irradiation region for one time can be expanded so that the time for the laser annealing processing per substrate can be shortened. Furthermore, by shortening the beam concave width (the beam concave width 304 shown in FIG. 5) of the concave pattern 312a, the high-density grain boundary area 316 which is generated in the amorphous silicon 311 corresponding to the beam irradiation start position can be narrowed compared to the case of the zigzag pattern. Further, as shown in FIG. 5(2), since a side 306a on the front side of the beam 306 is a straight line which extends towards the direction vertical to the scanning direction, the high-density grain boundary region 316 generated in the beam irradiation end position on the amorphous silicon 311 is about the crystal growth distance achieved by one-time irradiation. The high-density grain boundary region generated in the beam irradiation end position in the case of the zigzag pattern is as large as about the sum of the scanning direction length of the zigzag pattern and the crystal growth distance achieved by the one-time irradiation. Also, as for the concave pattern 306c, the step for manufacturing the mask is easier than that of the zigzag pattern so that the manufacturing cost can be decreased. Further, forming the concave pattern 306c of the beam 306 does not require the high resolution as much in the optical system of the leaser annealing device as the case of forming the beam shape of the zigzag pattern. Thereby, the shortcomings of the conventional zigzag pattern beam can be overcome.

Further, the TFT manufactured by using the obtained semiconductor thin film can improve the mobility of the carrier and suppress the dispersions in the mobility and the threshold voltage. Also, the embodiment is described by referring to the case where the concave pattern 306c is in a rectangular shape, however, it is not limited to this. The concave pattern 306c may be a polygon such as a triangle or may be semicircle, semiellipse, or the like.

In brief, the embodiment of the present invention is subjected to a semiconductor thin film manufacturing method for growing the crystal film on the semiconductor thin film by irradiating the laser beam (102, 1602) onto the semiconductor thin film (311, 1603) formed on the insulating substrate (110), wherein, in a laser beam shaping step, a part of the irradiation pattern of the laser beam to be irradiated onto the semiconductor thin film is shaped into a control pattern (concave pattern 312a). In this case, the grain diameter of the semiconductor thin film and that of the crystal film may be set different for growing the crystal, respectively.

When shaping the irradiation pattern of the laser beam irradiated onto the semiconductor thin film to a rectangular shape (FIG. 5, FIG. 7), the irradiation pattern is shaped into a shape which is a rectangle and also has the control pattern in a side of the rectangle. Then, the band-form crystal grain is grown by performing the position control of the crystal grain boundaries by the control pattern.

The embodiment of the present invention can be applied both to the case where the band-form crystal grain is formed on the semiconductor thin film by a single shot without scanning the laser beam (102) and to the case where the band-form crystal grain is formed by scanning the laser beam. When scanning the laser beam, the band-form crystal grain is grown by irradiating the laser beam of the irradiation pattern including the control pattern. In this case, the band-form crystal grain is grown by performing the position control of the crystal grain boundaries by the control pattern which is formed in the side opposite to the side on the laser beam scanning direction side. When scanning the laser beam, the band-form crystal grain is formed in between the position-controlled crystal grain boundaries each time the laser beam is irradiated. By these band-form crystal grains, the band-form crystal region (318) is formed in the region sandwiched in between the parallel crystal grain boundaries.

Figure 7:
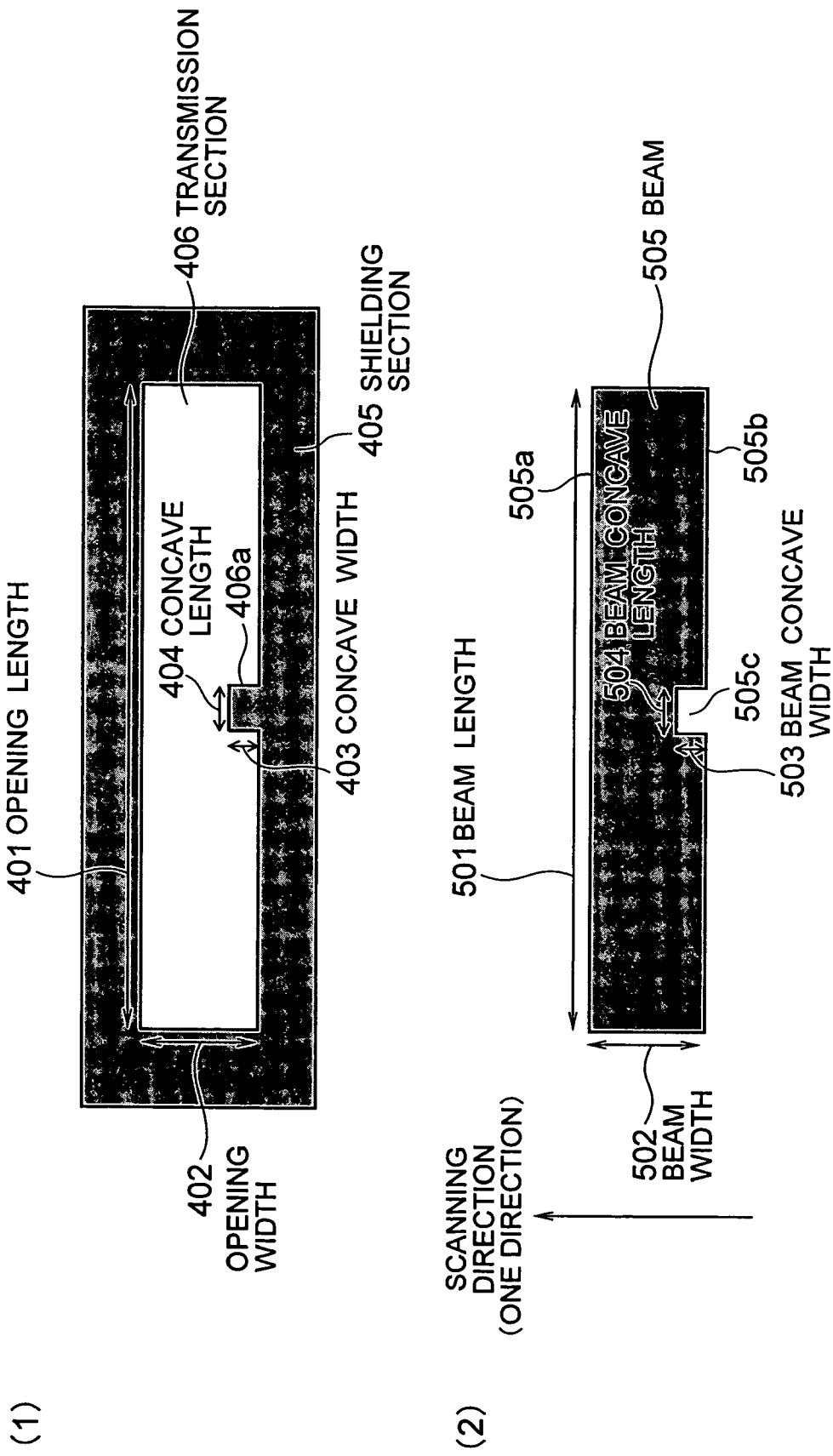
FIG. 7 (1) is a plan view for showing a second example of the mask according to the present invention and FIG. 7(2) is a plan view for showing the beam shape.

As for the beam shaping mask used for the semiconductor thin film manufacturing method according to the embodiment of the present invention, the main body of the mask has a configuration which comprises shielding patterns (206a, 406a) for shielding the laser beam in a part of the transmission region (transmission section 207) where the laser beam is transmitted. In the case where the transmission region is formed in a rectangular shape, it is formed in a shape with an opening having the shielding pattern in a side of the rectangle (FIG. 5, FIG. 7). The shielding pattern is formed in a convex pattern shape which projects from the shielding region of the laser beam towards the transmission region.

It is desirable to set the dimensional relation to be $2L \geq A-B$, provided that an opening width (the opening widths 203, 402) in a width direction of the transmission region (the transmission sections 207, 407) is A, a concave width (concave widths 204, 403) in a width direction of the shielding pattern (206a, 406a) is B, and the maximum crystal growth distance of the band-form crystal grain in the width direction is L. Further, it is desirable to set the dimensional relation to be $2L \geq C+D$, provided that a concave length (202, 404) in a length direction of the shielding pattern (206a, 406a) is C, a convex length (205) which is a space in between the shielding patterns is D, and the maximum crystal growth distance of the band-form crystal grain in the width direction (the beam width 303, 502) of the transmission region is L.

Further, the dimensional relation may be set as $A-B \geq C+D$, provided that an opening width (203, 402) in a width direction of the transmission region is A, a concave width (204, 403) in a width direction of the shielding pattern is B, a concave length (202, 404) in a length direction of the shielding pattern is C, and a convex length (205) which is a space in between the shielding patterns is D.

Next, described are EXAMPLES which more specifically embody the embodiment of the present invention.

EXAMPLE 1

Laser annealing was performed using the laser annealing device shown in FIG. 4. The method, the mask, and the laser used therefore were the ones described in the embodiment. As for the openings and the transmission section formed in the mask, a large number of slots in an extremely narrow width may be formed in line to be the openings and the like, or a large number of pores may be collectively formed to be the openings and the like. In this case, by changing the number of the slits or the density of the pores, the energy of the laser light can be altered. The substrate will be described. A no alkali glass was used for the glass substrate. On the glass substrate, an insulating film for preventing diffusion of impurities from the glass was formed. On the insulating film, an amorphous silicon film of 60 nm as the precursor film was formed by low pressure chemical vapor deposition (LP-CVD).

In this EXAMPLE, scanning irradiation was performed by using the mask in a shape shown in FIG. 7(1). The irradiation condition is shown in TABLE 1. The irradiation intensity is the value on the substrate. The step width of the laser beam scanning is the distance on the substrate scanned by the laser beam between each irradiation of the rectangular laser beam. The mask shown in FIG. 7(1) has a structure which has a convex pattern (convex shielding pattern 406b) with a concave length 404 and a concave width 403 within an opening with an opening width 402 and an opening length 401. The beam passed through the mask becomes in the shape shown in FIG. 7(2) on the substrate. That is, a beam 505 is shaped into the beam shape with a beam length 501 and a beam width 502, having a single concave pattern (control pattern) 505c on a side 505a on the scanning direction (one direction) side and on a side 505b on the opposite side. The concave pattern 505c is in the size having the beam concave length 504 and the beam concave width 503. In FIG. 7(2), the scanning direction of the beam is shown by an arrow. The beam size on the substrate becomes the ⅓ of the beam size on the mask. That is, the beam width 502 is 10 μm, the beam concave length 504 is 1 μm, and the beam concave width 503 is 5 μm.

TABLE 1

| EXAMPLE 1 | |
|---|---|
| Irradiation intensity (mJ/cm$^2$) | 600 |
| Step width (μm) | 0.5 |
| Opening width (μm) | 30 |
| Concave length (μm) | 3 |
| Concave width (μm) | 15 |

Figure 8:
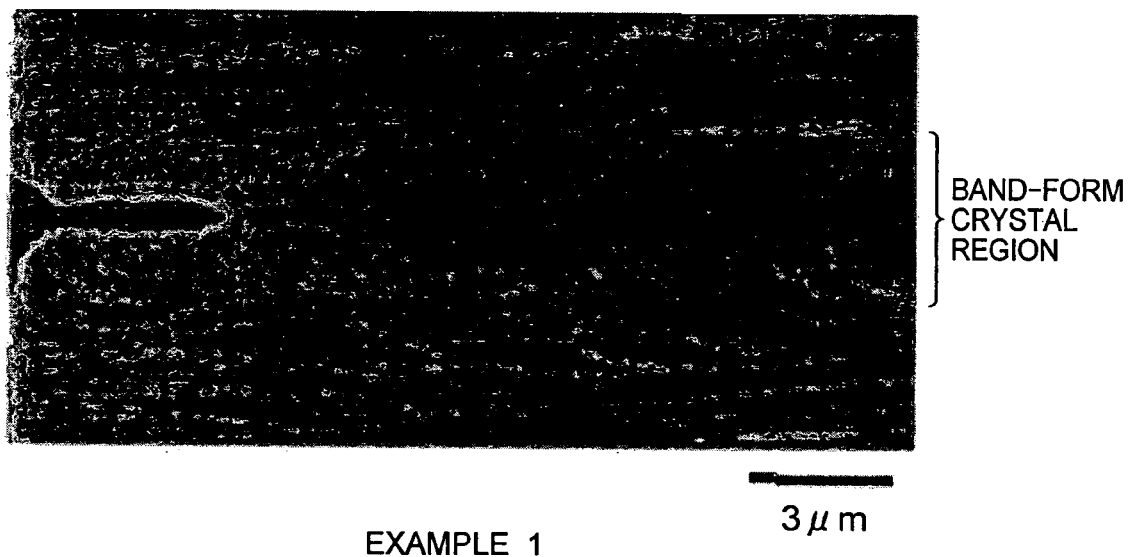
FIG. 8 is an illustration for showing an SEM image of the polycrystalline film surface formed in EXAMPLE 1.

FIG. 8 shows the result of SEM observation after secco-etching. A band-form crystal region with the crystal growth width 2 μm is formed in a region sandwiched in between the crystal grain boundaries which are in parallel with the beam scanning direction (in the horizontal direction of FIG. 8). It was verified that the band-form crystal region was corresponded to the position of the concave pattern 505c. In the periphery of the band-form crystal grains formed in the direction crossing with the beam scanning direction, grain boundaries slant against the scanning direction were formed. Further, in the periphery of the band-form crystal grains, the crystal grain boundaries were generated at random in the beam length direction as found in the case of the conventional narrow-line beam. The temperature gradient was formed radially on the amorphous silicon with the position corresponding to the tip of the concave pattern 505c being the center, so that the crystal was grown in the beam length direction (in the direction crossing with the beam scanning direction). Therefore, the crystal growth width of the band-form crystal grain in the beam length direction can be extended compared to the case of the conventional narrow-line beam. As described above, it is verified that, with the manufacturing method according to the embodiment of the present invention, it is possible to form the band-form crystal region which grows in the beam scanning length direction in the region being sandwiched in between the crystal grain boundaries which are position-controlled and also wider than the case of the conventional narrow-line beam. The crystal growth width in the beam length direction is simply referred to as a crystal growth width.

EXAMPLE 2

By using the same laser annealing device as that of EXAMPLE 1 and the mask in the shape shown in FIG. 7(1), scanning irradiation was performed by changing the beam concave length from 1.5 μm, 3 μm, 6 μm and to 12 μm. The irradiation condition is shown in TABLE 2. The irradiation intensity is the value on the substrate. The step width is the distance on the substrate scanned between each irradiation. The opening width 402, the concave length 404, and the concave width 403 in the TABLE are the values on the mask. The beam passed through the mask becomes in the shape shown in FIG. 7(2) on the substrate. The beam size on the substrate becomes the ⅓ of the beam size on the mask. That is, the beam width 502 is 10 μm, the beam concave length 504 is 0.5 μm, 1 μm, 2 μm, or 4 μm, and the beam concave width 503 is 5 μm.

TABLE 2

|  | EXAMPLE | | | |
| --- | --- | --- | --- | --- |
|  | 2-1 | 2-2 | 2-3 | 2-4 |
| Irradiation intensity (mJ/cm²) | 600 | 600 | 600 | 600 |
| Step width (μm) | 0.5 | 0.5 | 0.5 | 0.5 |
| Opening width (μm) | 30 | 30 | 30 | 30 |
| Concave length (μm) | 1.5 | 3 | 6 | 12 |
| Concave width (μm) | 15 | 15 | 15 | 15 |

FIG. 9 shows the result of SEM observation after secco-etching. In the case where the concave length was 1.5 μm (beam concave length was 0.5 μm) (EXAMPLE 2-1), the band-form crystal region was formed in the scanning direction with the tip of the concave pattern being the start point. The crystal growth width was 1.6 μm.

In the case where the concave length was 3 μm (beam concave length was 1 μm) (EXAMPLE 2-2), the band-form crystal region was formed as in the case of the 1.5 μm concave length. In this case, the crystal growth width of the band-form crystal grain in the region sandwiched by the parallel crystal grain boundaries was 2.0 μm which was being extended compared to the case of 1.5 μm concave length.

In the case where the concave length was 6 μm (beam concave length was 2 μm) (EXAMPLE 2-3), a large number of crystal grain boundaries slanting against the scanning direction were generated in a part of the region scanned by the concave pattern. The reasons for this may be that there were a large number of crystal nuclei generated on the semiconductor thin film corresponding to the concave tip of the concave pattern 505c due to the extended concave length and that the temperature gradient in the beam length direction became moderate in the center of the beam length direction of the concave pattern 505c.

In the case where the concave length was 12 μm (beam concave length was 4 μm) (EXAMPLE 2-4), the concave length was further extended. Thus, the crystal grain boundaries were formed at random in the beam length direction in the center of the concave beam length direction, which was seen in the case of the conventional narrow-line beam.

As can be seen from the above-described EXAMPLES, by setting the beam concave length 504 of the concave pattern 505c to be equal or smaller than the beam concave width 503 in which the crystal growth width of the band-form crystal grain becomes the maximum, it is possible to form the band-form crystal region in which the crystal grain boundary position is well-controlled.

In the irradiation conditions of the EXAMPLES, by setting the beam concave length 504 to be 3 μm (beam concave width 503; 1 μm) or less, the band-form crystal region with the well-controlled crystal grain boundary position can be formed. Thereby, it becomes possible to manufacture the TFT with high mobility and less dispersion in the performance. However, the preferable beam concave length varies in accordance with changes in the film thickness of the precursor film, the method of forming the film, the irradiation intensity of the beam, or the resolution of the optical system. Thus, the beam concave length may be set appropriately according to the conditions.

EXAMPLE 3

Scanning irradiation was performed by using the same laser annealing device as that of EXAMPLE 1 and the mask in the shape as shown in FIG. 5(1) in which the concave patterns 306c were periodically formed. The irradiation condition is shown in TABLE 3. The irradiation intensity is the value on the substrate. The step width is the distance on the substrate scanned between each irradiation. The opening width 203, the concave length 202, the concave width 204, and the convex length 205 in the TABLE are the values on the mask. The beam passed through the mask becomes in the shape shown in FIG. 5(2) on the substrate. The beam size on the substrate becomes the ⅓ of the beam size on the mask. That is, the beam width 303 is 6 μm, the beam concave length 302 is 1 μm, the beam concave width 304 is 3 μm, and the beam convex length 305 is 1 μm.

TABLE 3

|  | EXAMPLE 3 |
| --- | --- |
| Irradiation intensity (mJ/cm²) | 600 |
| Step width (μm) | 0.2 |
| Opening width (μm) | 18 |
| Concave length (μm) | 3 |
| Concave width (μm) | 9 |
| Convex length (μm) | 3 |

FIG. 10(1) shows the result of SEM observation after secco-etching. The band-form crystal regions with the crystal growth width 2 μm were formed in parallel in the scanning direction from the tip of each concave pattern. When the results of FIG. 8 (EXAMPLE 1) and FIG. 10 (1) (EXAMPLE 3) are compared, there is no change being observed in the sizes of the band-form crystal regions and the crystal states. It can be said that there is no influence in the crystal state of the formed band-form crystal grain even when the concave patterns are periodically arranged. Further, the band-form crystal region can be formed in line in the region sandwiched in between the parallel crystal grain boundaries so that a plurality of the band-form crystal regions can be formed by one-time scanning irradiation. This EXAMPLE illustrates the case of the periodical scanning patterns. However, it is not necessary to form the concave patterns at equal intervals but it may be designed as appropriate so as to form the band-form crystal regions in the desired positions. These band-form crystal regions along the length direction of the crystal boundaries are formed by the band-form crystal grains which are grown in the direction crossing with the length direction (the beam scanning direction) of the crystal grain boundaries.

EXAMPLE 4

Scanning irradiation was performed by changing the concave length from 6 μm to 3 μm using the same laser annealing device as that of EXAMPLE 1 and the mask in the shape as shown in FIG. 5(1) in which the concave patterns were periodically formed. The irradiation condition is shown in TABLE 4. The irradiation intensity is the value on the substrate. The step width is the distance on the substrate scanned between each irradiation. The opening width 203, the concave length 202, the concave width 204, and the convex length 205 in the TABLE are the values on the mask. The beam passed through the mask becomes in the shape shown in FIG. 5(2) on the substrate. The beam size on the substrate becomes the ⅓ of the beam size on the mask. That is, the beam width 303 is 10 μm, the beam concave length 302 is 1 μm, the beam concave width 304 is 5 μm, and the beam convex length 305 is 1 μm, 2 μm.

TABLE 4

|  | EXAMPLE | |
| --- | --- | --- |
|  | 4-1 | 4-2 |
| Irradiation intensity (mJ/cm$^2$) | 600 | 600 |
| Step width (μm) | 1 | 1 |
| Opening width (μm) | 30 | 30 |
| Concave length (μm) | 3 | 3 |
| Concave width (μm) | 15 | 15 |
| Convex length (μm) | 6 | 3 |

FIG. 10(2) shows the result of SEM observation after secco-etching. In the case where the convex length was 6 μm (beam convex length was 2 μm) (EXAMPLE 4-1), the band-form crystal grain grown from the beam concave tip as the start point were formed at 3 μm interval in the direction vertical to the beam scanning direction, and a large number of parallel crystal grain boundaries were formed in between the band-form crystal regions. As shown in EXAMPLE 2-2, the crystal growth width of the band-form crystal grain by the concave length of 3 μm (the beam concave length of 1 μm) was about 2 μm. The reason may be that a large number of the crystal grain regions were generated since the cycle of the concave pattern was longer than the crystal growth width of the band-form crystal grain.

In the case where the convex length was 3 μm (beam convex length was 1 μm) (EXAMPLE 4-2), the large number of crystal grain boundaries formed in EXAMPLE 4-1 disappeared and the band-form crystal grains with the crystal growth width of 2 μm were continuously formed at 2 μm interval in the direction vertical to the scanning direction. It is considered to be caused since the interval of the concave patterns was equal or lass than the crystal growth width of the band-form crystal grain.

As can be seen from the above-described results, when the interval of the concave patterns in the beam plane shape on the precursor film is equal or less than the length which is substantially the same as the crystal growth width of the band-form crystal grain, the band-form crystal grains can be formed continuously in the direction vertical to the scanning direction. Thus, it is possible to effectively form the band-form crystal regions in the region sandwiched in between the parallel crystal grain boundaries. Further, when forming the TFT with the longer channel length and the channel width than the crystal growth width of the band-form crystal grain, it is possible to form the TFT with high mobility and less dispersion in the performance since it can be manufactured without including a large number of crystal grain boundaries within the channel.

EXAMPLE 5

Scanning irradiation was performed by changing the concave width from 15 μm, 9 μm and to 3 μm using the same laser annealing device as that of EXAMPLE 1 and the mask in the shape as shown in FIG. 5(1) in which the concave patterns were periodically formed. The irradiation condition is shown in TABLE 5. The irradiation intensity is the value on the substrate. The step width is the distance on the substrate scanned between each irradiation. The opening width 203, the concave length 202, the concave width 204, and the convex length 205 in the TABLE are the values on the mask. The beam passed through the mask becomes in the shape shown in FIG. 5(2) on the substrate. The beam size on the substrate becomes the ⅓ of the beam size on the mask. That is, the beam width 303 is 8 μm or 6 μm, the beam concave length 302 is 1 μm, the beam concave width 304 is 3 μm or 1 μm, and the beam convex length is 1 μm.

TABLE 5

|  | EXAMPLE | |
| --- | --- | --- |
|  | 5-1 | 5-2 |
| Irradiation intensity (mJ/cm$^2$) | 600 | 600 |
| Step width (μm) | 1 | 1 |
| Opening width (μm) | 24 | 18 |
| Concave length (μm) | 3 | 3 |
| Concave width (μm) | 9 | 3 |
| Convex length (μm) | 3 | 3 |

FIG. 11(1) shows the result of SEM observation after secco-etching. In the case of EXAMPLE 5-2 (the concave width was 3 μm (beam concave length was 1 μm)), a larger number of crystal grain boundaries were formed compared to EXAMPLE 5-1 (the concave width was 9 μm (the beam concave width was 3 μm)) It is considered that the effect of forming the band-form crystal grains of the concave pattern was deteriorated since the concave width was shorter than that of EXAMPLE 5-1.

As can be seen from the above-described results, by setting the concave width to be equal or larger than the concave width of the band-form crystal grains where the crystal growth width becomes the maximum (that is, by setting the concave width equal or larger than 9 μm (the beam concave width of 3 μm) in the irradiation condition of this EXAMPLE), the band-form crystal region with the well-controlled crystal grain boundary position can be formed. Thereby, it becomes possible to form the TFT with high mobility and less dispersion in the performance. However, the preferable beam concave length varies in accordance with changes in the film thickness of the precursor film, the method of forming the film, the irradiation intensity of the beam, or the resolution of the optical system. Thus, the beam concave length may be set appropriately according to the conditions.

EXAMPLE 6

Scanning irradiation was performed by using the same laser annealing device as that of EXAMPLE 1 and the mask in the shape as shown in FIG. 5(1) in which the concave patterns were periodically formed. The irradiation condition is shown in TABLE 6. The irradiation intensity is the value on the substrate. The step width is the distance on the substrate scanned between each irradiation. The opening width 203, the concave length 202, the concave width 204, and the convex length 205 in the TABLE are the values on the mask. The beam passed through the mask becomes in the shape shown in FIG. 5(2) on the substrate. The beam size on the substrate becomes the ⅓ of the beam size on the mask. That is, the beam width 303 is 6 μm, the beam concave length 302 is 1 μm, the beam concave width 304 is 1 μm, and the beam convex length 305 is 1 μm.

TABLE 6

| EXAMPLE 6 | |
|---|---|
| Irradiation intensity (mJ/cm$^2$) | 600 |
| Step width (μm) | 1 |
| Opening width (μm) | 18 |
| Concave length (μm) | 3 |
| Concave width (μm) | 3 |
| Convex length (μm) | 3 |

In the irradiation condition of this EXAMPLE, it is possible to form the band-form crystal region with well-controlled crystal grain boundary position (that is, in the region sandwiched by the parallel crystal grain boundaries), even with the concave width of 3 μm (the beam concave width of 1 μm). It was verified in this EXAMPLE that the band-from crystal grains could be formed in the direction crossing with the length direction of the crystal grain boundaries even when the beam concave width was a small dent of 1 μm. Thereby, in spite that the band-form crystal grains can be formed in the desired positions, the device transmittivity similar to that of the conventional narrow-line beam can be achieved. Further, the high-density grain boundary region can be narrowed in the scanning start position and the end position. The transmittivity of the mask at this time was 62% (laser transmittivity was 9%). Further, the mask transmittivity of the zigzag pattern at 60° angle was 43% (laser trasnmittivity was 6%). From this, it is evident that the beam length can be extended and the processing can be performed in a short time since the trasnmittivity of the laser light is high in the pattern of the present invention.

EXAMPLE 7

The polycrystalline regions in which the band-form crystal grains with the crystal growth width of 2 μm were continuously lined in the direction vertical to the scanning direction were formed by performing scanning irradiation for the length of 300 μm by using the same laser annealing device as that of EXAMPLE 1 and the mask in the shape as shown in FIG. 5(1) in which the concave patterns were periodically formed. The irradiation condition is shown in TABLE 7. The irradiation intensity is the value on the substrate. The step width is the distance on the substrate scanned between each irradiation. The opening width 203, the concave length 202, the concave width 204, and the convex length 205 in the TABLE are the values on the mask. The beam passed through the mask becomes in the shape shown in FIG. 5(2) on the substrate. The beam size on the substrate becomes the ⅓ of the beam size on the mask. That is, the beam width 303 is 6 μm, the beam concave length 302 is 1 μm, the beam concave width 304 is 3 μm, and the beam convex length 305 is 1 μm.

TABLE 7

| EXAMPLE 7 | |
|---|---|
| Irradiation Intensity (mJ/cm$^2$) | 600 |
| Step width (μm) | 1 |
| Opening width (μm) | 30 |
| Concave length (μm) | 3 |
| Concave width (μm) | 15 |
| Convex length (μm) | 3 |

As shown in FIG. 6(3), in the obtained semiconductor thin film as described in the embodiment, the protrusions 317 were formed in a check pattern only on the crystal grain boundaries 315. A thin film transistor was manufactured by using the semiconductor thin film obtained by the EXAMPLE of the present invention shown in FIG. 6(3). Specifically, as shown in FIG. 12(1), in the semiconductor thin film according to the EXAMPLE of the present invention, the crystal grain boundaries 603 which were in parallel were formed along the scanning direction of the laser beam and the single-crystal region (band-form crystal region) 602 was formed in the region between the crystal grain boundaries 603 along the scanning direction. This indicates that in the EXAMPLE of the present invention, the positions of the crystal grain boundaries 603 were controlled so that the crystal grain boundaries 603 were formed in parallel in the scanning direction of the laser beam.

As shown in FIG. 12(1), an island 601 was formed in the region including the single-crystal regions 602, 602a, 602b and the crystal grain boundaries 603. The island 601 was formed in a rectangular shape with the length of 10 μm in the scanning direction and the length of 4 μm in the direction orthogonal to the scanning direction. Further, as shown in FIG. 12(2), the single-crystal region 602 sandwiched in between the crystal grain boundaries 603 was used as an active layer and the carriers were to move within the active layer (602) in the scanning direction of the laser beam. Thus, a drain region 703 and a source region 701 were formed in the scanning direction with the active layer (602) in between. Then, a contact 704 for connecting a drain electrode (not shown) and the drain region 703 was formed on an insulating film (not shown). Similarly, a contact 705 for connecting a source electrode (not shown) and the source region 701 was formed on an insulating film (not shown). Also, a gate electrode 702 was formed. Thereby, the moving direction of the carriers was set in the scanning direction, and an n-type TFT and a p-type TFT in which the channel length of the active layer 602 was 4 μm and the channel width was 4 μm were manufactured. The mobility of the carrier in the obtained TFT was 10 cm$^2$/Vs for the n-type and 150 cm$^2$/Vs for the p-type. Further, the dispersion of the threshold voltage for one-hundred n-type TFTs was 0.2 V.

As a comparison, a polycrystalline film was manufactured by using the same laser annealing device as that of EXAMPLE 1 through performing scanning irradiation for a length of 300 μm by the beam which is shaped by the narrow-line pattern mask with no concave pattern. Here, the beam is shaped into an opening length of 270 μm, an opening width of 9.9 µm on the mask, and an opening length of 90 µm, an opening width of 3.3 µm on the substrate.

In the semiconductor thin film obtained in the COMPARATIVE EXAMPLE, the protrusions were formed at random. The irradiation intensity was 600 mJ/cm², and the step width was 0.2 µm on the substrate. The polycrystal was used as the active layer and the channel was so provided that the carriers moved in parallel with the scanning direction for manufacturing the n-type TFT and the p-type TFT with the channel length of 4 µm and the channel width of 4 µm. The mobility of the carrier in the TFT was 320 cm²/Vs for the n-type and 120 cm²/Vs for the p-type. Further, the dispersion of the threshold voltage for one-hundred n-type TFTs was 1 V.

From the comparison of the mobility in the two kinds of TFTs as described above, it is evident that it is possible with the TFT which satisfies the required conditions of the present invention to achieve the higher mobility than that of the TFT manufactured by the conventional narrow-line. Thus, it is possible to provide the high-performance TFT by the present invention. Further, it is evident that it is possible with the TFT which satisfies the conditions of the present invention to obtain the TFT with the smaller dispersion in the threshold voltage compared to the TFT manufactured by using the semiconductor thin film with random protrusions, which is manufactured by the conventional narrow-line beam. Therefore, it is possible to provide the high-performance TFT by the present invention.

EXAMPLE 8

The polycrystalline regions in which the band-form crystal grains with the crystal growth width of 2 µm were continuously lined in the direction vertical to the scanning direction were formed by performing scanning irradiation for the length of 300 µm by using the same laser annealing device as that of EXAMPLE 1 and the mask in the shape as shown in FIG. 5(1) in which the concave patterns were periodically formed. The irradiation condition is shown in TABLE 7. The irradiation intensity is the value on the substrate. The step width is the distance on the substrate scanned between each irradiation. The opening width, the concave length, the concave width, and the convex length in the TABLE are the values on the mask. The beam passed through the mask becomes in the shape shown in FIG. 5(2) on the substrate. The beam size on the substrate becomes the ⅓ of the beam size on the mask. That is, the beam width 303 is 6 µm, the beam concave length 302 is 1 µm, the beam concave width 304 is 3 µm, and the beam convex length 305 is 1 µm.

As shown in FIG. 6(3), in the obtained semiconductor thin film as described in the embodiment, the protrusions 317 were formed in a check pattern only on the crystal grain boundaries 315. A thin film transistor was manufactured by using the semiconductor thin film obtained by the EXAMPLE of the present invention shown in FIG. 6(3). Specifically, as shown in FIG. 13(1), in the semiconductor thin film according to the EXAMPLE of the present invention, the crystal grain boundaries 803 which were in parallel were formed along the scanning direction of the laser beam and the single-crystal region (band-form crystal region) 802 was formed in the region between the crystal grain boundaries 803 along the scanning direction. This indicates that in the EXAMPLE of the present invention, the positions of the crystal grain boundaries 803 were controlled so that the crystal grain boundaries 803 were formed in parallel in the scanning direction of the laser beam.

As shown in FIG. 13(1), an island 801 was formed by limiting the region to be within the single-crystal region 802 sandwiched in between the crystal grain boundaries 803. This EXAMPLE was different from the one shown in FIG. 12 in respect that the island 801 was formed by avoiding the single-crystal regions 802a, 802b and the crystal grain boundaries 803. The island 801 was formed in a rectangular shape with the length of 5 µm in the scanning direction and the length of 4 µm in the direction orthogonal to the scanning direction. Further, as shown in FIG. 13(2), the single-crystal region 802 sandwiched in between the crystal grain boundaries 803 was used as an active layer and the carriers were to move within the active layer (802) in the scanning direction of the laser beam. Thus, a drain region 903 and a source region 902 were formed in the scanning direction with the active layer (802) in between. Then, a contact 904 for connecting a drain electrode (not shown) and the drain region 903 was formed on an insulating film (not shown) Similarly, a contact 905 for connecting a source electrode (not shown) and the source region 902 was formed on an insulating film (not shown). And, an n-type TFT and a p-type TFT were manufactured, in which the channel length of the active layer 802 was 1.4 µm, the channel width was 1.4 µm and the moving direction of the carrier became the scanning direction.

The mobility of the carrier in the obtained TFT was 520 cm²/Vs for the n-type and 200 cm²/Vs for the p-type. In order to form the channel in the band-form single-crystal region 802 with the crystal grain width of 2 µm, it is desirable to set the channel width to be 2 µm or less, and more preferable to be 1.8 µm or less. Further, the dispersion of the threshold voltage for one-hundred n-type TFTs was 0.2 V.

As a comparison, a polycrystalline film was manufactured by using the same laser annealing device as that of EXAMPLE 1 through performing scanning irradiation for a length of 300 µm by the beam which was shaped by the narrow-line pattern mask with no concave pattern. Here, the beam is shaped into an opening length of 270 µm, an opening width of 9.9 µm on the mask, and an opening length of 90 µm, an opening width of 3.3 µm on the substrate.

In the semiconductor thin film obtained in the COMPARATIVE EXAMPLE, the protrusions were formed at random. The irradiation intensity was 600 mJ/cm², and the step width was 0.2 µm on the substrate. The channel was so provided that the carriers moved in parallel with the scanning direction for manufacturing the n-type TFT and the p-type TFT with the channel length of 1.4 µm and the channel width of 1.4 µm. Since the positions of the crystal grain boundaries were not controlled, there were crystal grain boundaries present within the channel. The mobility of the carrier in the TFT was 320 cm²/Vs for the n-type and 120 cm²/Vs for the p-type. Further, the dispersion of the threshold voltage for one-hundred n-type TFTs was 0.15 V.

From the comparison of the mobility in the two kinds of TFTs as described above, it is evident that it is possible with the TFT which satisfies the required conditions of the present invention to achieve the higher mobility than that of the conventional TFT. Thus, it is possible to provide the high-performance TFT by the present invention. Further, it is evident that it enables to obtain the TFT with still high performance by forming the channel within the band-form crystal grain since the mobility in the present invention is higher than that of the TFT illustrated by EXAMPLE 7. Further, it is evident that it is possible with the TFT which satisfies the conditions of the present invention to obtain the TFT with the smaller dispersion in the threshold voltage compared to the TFT manufactured by using the semiconductor thin film with random protrusions, which is manufactured by the conventional narrow-line beam. Therefore, it is possible to provide the high-performance TFT by the present invention.

EXAMPLE 9

The band-form crystal grains with the crystal growth width of 2 μm being continuously lined in the direction vertical to the scanning direction were formed by performing scanning irradiation for the length of 300 μm by using the same laser annealing device as that of EXAMPLE 1 and the mask in the shape as shown in FIG. 5(1) in which the concave patterns were periodically formed. The irradiation condition is shown in TABLE 7. The irradiation intensity is the value on the substrate. The step width is the distance on the substrate scanned between each irradiation. The opening width 203, the concave length 202, the concave width 204, and the convex length 205 in the TABLE are the values on the mask. The beam passed through the mask becomes in the shape shown in FIG. 5(2) on the substrate. The beam size on the substrate becomes the ⅓ of the beam size on the mask. That is, the beam width 303 is 6 μm, the beam concave length 302 is 1 μm, the beam concave width 304 is 3 μm, and the beam convex length 305 is 1 μm.

As shown in FIG. 6(3), in the obtained semiconductor thin film as described in the embodiment, the protrusions 317 were formed in a check pattern only on the crystal grain boundaries 315. A thin film transistor was manufactured by using the semiconductor thin film obtained by the EXAMPLE of the present invention shown in FIG. 6(3). Specifically, as shown in FIG. 14 (1), in the semiconductor thin film according to the EXAMPLE of the present invention, the crystal grain boundaries 1003 which were in parallel were formed along the scanning direction of the laser beam and the single-crystal region (band-form crystal region) 1002 was formed in the region between the crystal grain boundaries 1003 along the scanning direction. This indicates that in the EXAMPLE of the present invention, the positions of the crystal grain boundaries 1003 were controlled so that the crystal grain boundaries 1003 were formed in parallel in the scanning direction of the laser beam.

As shown in FIG. 14(1), an island 1001 was formed in the region including the single-crystal regions 1002, 1002*a*, 1002*b* and the crystal grain boundaries 1003. The island 1001 was formed in a rectangular shape with the length of 4 μm in the scanning direction and the length of 5 μm in the direction orthogonal to the scanning direction. Further, as shown in FIG. 14 (2), the single-crystal region 1002 sandwiched in between the crystal grain boundaries 1003 was used as an active layer and the carriers were to move within the active layer (1002) in the direction orthogonal to the scanning direction of the laser beam. Thus, a drain region 1102 and a source region 1101 were formed in the direction orthogonal to the scanning direction with the active layer (1002) in between. Then, a contact 1105 for connecting a drain electrode (not shown) and the drain region 1102 was formed on an insulating film (not shown). Similarly, a contact 1104 for connecting a source electrode (not shown) and the source region 1101 was formed on an insulating film (not shown). Also, a gate electrode 1103 was formed. Thereby, the moving direction of the carriers was set in the direction orthogonal to the scanning direction, and an n-type TFT and a p-type TFT in which the channel length of the active layer 1002 was 1.4 μm and the channel width was 4 μm were manufactured.

The mobility in the obtained TFT was 520 $cm^2$/Vs for the n-type and 200 $cm^2$/Vs for the p-type. In order to form the channel within the grain of the band-form crystal grains with the crystal grain width of 2 μm, it is desirable to set the channel length to be 2 μm or less and more preferable to be 1.8 μm or less. Further, the dispersion of the threshold voltage for one-hundred n-type TFTs was 0.15 V.

As a comparison, a polycrystalline film was manufactured by using the same laser annealing device as that of EXAMPLE 1 through performing scanning irradiation for a length of 300 μm by the beam which was shaped by the narrow-line pattern mask with no concave pattern. Here, the beam is shaped into an opening length of 270 μm, an opening width of 9.9 μm on the mask, and an opening length of 90 μm, an opening width of 3.3 μm on the substrate. In the semiconductor thin film obtained in the comparative example, the protrusions were formed at random. The irradiation intensity was 600 mJ/$cm^2$, and the step width was 0.2 μm on the substrate.

The channel was so provided that the carriers moved in parallel with the scanning direction for manufacturing the n-type TFT and the p-type TFT with the channel length of 1.4 μm and the channel width of 4 μm. Since the positions of the crystal grain boundaries were not controlled, there were crystal grain boundaries present within the channel by interrupting the transition of the carrier. The mobility of the carrier in the obtained TFT was 150 $cm^2$/Vs for the n-type and 100 $cm^2$/Vs for the p-type. Further, the dispersion of the threshold voltage for one-hundred n-type TFTs was 0.15 V.

From the comparison of the mobility in the two kinds of TFTs as described above, it is evident that it is possible with the TFT which satisfies the required conditions of the present invention to achieve the higher mobility than that of the conventional TFT. Thus, it is possible to provide the high-performance TFT by the present invention. Further, since the mobility is higher compared to the TFT illustrated by EXAMPLE 7, it is possible to form the channel within the band-form crystal by setting the TFT such that the carrier running direction becomes in the direction vertical to the scanning direction, when the crystal growth width is longer than the channel length and shorter than the channel width as in this EXAMPLE. Thereby, the TFT with still higher performance can be formed. Further, it is evident that it is possible with the TFT which satisfies the conditions of the present invention to obtain the TFT with the smaller dispersion in the threshold voltage compared to the TFT manufactured by using the semiconductor thin film with random protrusions, which is manufactured by the conventional narrow-line beam. Therefore, it is possible to provide the high-performance TFT by the present invention.

EXAMPLE 10

An insulating film was formed on a non alkali glass and an amorphous silicon film 1601 of 60 nm was formed on the insulating film by low pressure chemical vapor deposition. Then, as shown in FIGS. 15 (1), (2), granular polyscrytalline silicon with the grain diameter of 0.1-1 μm was formed on the amorphous silicon film 1601 by performing scanning irradiation of a beam 1602 of XeCl excimer laser with the energy density of 360 mJ/$cm^2$ and the step width of 50 μm. The above-described granular crystal grain is a crystal grain with a smaller diameter than that of a band-form crystal grain to be described later and is referred to as a granular crystal grain 1603 in this specification for distinguishing it from the band-form crystal grain. Although the XeCl excimer laser was used in this EXAMPLE, the laser to be used may be other excimer laser such as a KrF laser, or a solid state laser such as Nd:YAG laser, Nd:YLF laser, Nd:YVO4 laser, or a gas laser such as carbon oxide gas laser, argon gas laser.

Then, scanning irradiation by a beam 1604 was selectively performed as shown in FIGS. 15(3), (4) on a region where the high mobility is required (for example, in a drive circuit region in a pixel display device comprising an active matrix substrate) by using a mask in the shape as shown in FIG. 5(1) in which the concave patterns were periodically formed. Thereby, formed was a band-form crystal grain 1605 with the crystal growth width of 2 μm being lined continuously in the direction vertical to the scanning direction as shown in FIG. 14(4).

The irradiation condition at this time is shown in TABLE 7. The irradiation intensity is the value on the substrate. The step width is the distance on the substrate scanned between each irradiation. The opening width 203, the concave length 202, the concave width 204, and the convex length 205 in the TABLE are the values on the mask shown in FIG. 5(1). The beam passed through the mask becomes in the shape shown in FIG. 5(2) on the substrate. The beam size on the substrate becomes the ⅓ of the beam size on the mask. That is, in FIG. 5(2), the beam width 303 is 6 μm, the beam concave length 302 is 1 μm, the beam concave width 304 is 3 μm, and the beam convex length 305 is 1 μm.

Then, after rotating the substrate by 90°, as shown in FIGS. 15(5), (6), scanning irradiation by a beam 1606 was performed by using a mask in the shape as shown in FIG. 5(1) in which the concave patterns were periodically formed. The irradiation condition is shown in TABLE 7. The irradiation may be performed by rotating the scanning direction by 90° without rotating the substrate by 90°.

TFTs were manufactured by using the obtained granular crystal grain 1603 and the band-form crystal grain 1605 as the active layer. In the case of using the band-form crystal grain 1605, the TFT was manufactured by setting the channel direction and the scanning direction in parallel with each other. As a result, the high mobility was obtained to an extent of 520 cm$^2$/Vs in the n-type and 200 cm$^2$/Vs in the p-type. As for the TFT using the band-form crystal grain 1605 as the active layer, the high mobility could be achieved when the channel direction of the TFT was in the scanning direction and in the direction vertical to the scanning direction as well. Thus, each of the scanning direction of the laser and the channel direction of the TFT may be designed as appropriate.

As described above, by selectively applying the beam scanning irradiation with a concave pattern which requires shortening of the step width onto a region requiring the high mobility, the processing speed per substrate can be improved compared to the case of irradiating the entire surface of the substrate.

The thin film transistor according to the embodiment of the present invention as described above will be summarized. The thin film transistor according to the embodiment of the present invention comprises a band-form crystal regions (602, 802, 1002) formed in a region sandwiched between parallel crystal grain boundaries (603, 803, 1003), and at least either the first active layer in which the moving direction of the carrier is set in the length direction of the crystal grain boundary or the second active layer in which the moving direction of the carrier is set in the direction crossing with the crystal grain boundary is formed on the single crystalline film.

When the first active layer is provided, the drain region (703, 903) and the source region (701, 902) of the first active layer are formed by sandwiching the active layer along the length direction of the crystal grain boundaries (603, 803). In this case, the source region and the drain region of the first active layer are formed so as to include the crystal grain boundaries and the band-form crystal region, or the source region and the drain region of the first active layer are formed only within the region of the band-form crystal region.

When the second active layer is provided, the drain region (1102) and the source region (1101) of the second active layer are formed by sandwiching the active layer along the direction crossing with the length direction of the crystal grain boundaries (1003). In this case, the source region and the drain region of the second active layer are formed so as to include the crystal grain boundaries and the band-form crystal region.

When the first active layer and the second active layer are provided, the drain region and the source region of the first active layer are formed by sandwiching the active layer along the direction crossing with the length direction of the crystal grain boundaries, and the drain region and the source region of the second active layer are formed by sandwiching the active layer along the direction crossing with the length direction of the crystal grain boundaries.

Further, the thin film transistor according to the embodiment of the present invention may be in the configuration, comprising the semiconductor thin film (1603) made with the granular crystal grains and the band-form crystal grains (1605) made with the crystal grains with a larger grain diameter than that of the granular crystal grains, in which the active layer is formed in the semiconductor thin film and the band-form crystal grain, respectively.

What is claimed is:

1. A method of manufacturing a semiconductor thin film for growing a crystal grain on the semiconductor thin film, the method comprising a step of:
controlling irradiation of a laser beam onto the semiconductor thin film to form a continuous irradiation pattern, said irradiation pattern including at least one control pattern inwardly extending into the irradiation pattern, said control pattern defining an area not to be irradiated by the laser beam, the control pattern is shaped into a concave shape with respect to an edge of the irradiation pattern.

2. The manufacturing method of a semiconductor thin film according to claim 1, wherein the irradiation pattern is shaped into a shape which is a rectangle and also has the control pattern extending into the rectangle at a side of the rectangle.

3. The manufacturing method of a semiconductor thin film according to claim 1, wherein the crystal grain comprises a band-form crystal grain grown on the semiconductor thin film while performing position control of the crystal grain boundaries by the control pattern.

4. The manufacturing method of a semiconductor thin film according to claim 1, wherein a band-form crystal region made with the band-form crystal grains is formed in a region sandwiched in between parallel crystal grain boundaries by irradiating the laser beam of the irradiation pattern including the control pattern onto the semiconductor thin film while scanning the laser beam.

5. The manufacturing method of a semiconductor thin film according to claim 1, wherein the control pattern is formed in a side opposite to a side on a scanning direction side of the laser beam for shaping the laser beam.

6. The manufacturing method of a semiconductor thin film according to claim 1, wherein a beam concave length in a length direction of the control pattern is set to be equal or less than a beam concave width in a width direction of the control pattern where a crystal growth width of the band-form crystal grain becomes the maximum.

7. The manufacturing method of a semiconductor thin film according to claim 1, wherein a beam concave width in a width direction of the control pattern is set to be equal or more than a beam concave width in a width direction of the control pattern where a crystal growth width of the band-form crystal grain becomes the maximum.

8. The manufacturing method of a semiconductor thin film according to claim 2, wherein more than one control pattern is shaped in the side of the rectangle.

9. The manufacturing method of a semiconductor thin film according to claim 8, wherein a cycle of shaping the control pattern is set to be equal or less than a length which is substantially same as the crystal growth width of a band-form crystal grain.

10. The manufacturing method of a semiconductor thin film according to claim 1, wherein the laser beam of an irradiation pattern having the control pattern is irradiated onto the semiconductor thin film made with granular crystal grains for crystal-growing, on the semiconductor thin film, a band-form crystal grain which is made with crystal grains larger than the crystal grains of the semiconductor thin film.

11. The method of manufacturing a semiconductor thin film according to claim 1, wherein, in the laser beam shaping step, said concave pattern is in a shape with three or more sides.

12. The method of manufacturing semiconductor thin film according to claim 1, wherein, in the laser beam shaping step, said concave pattern is in a shape with a curve.

13. The manufacturing method of a semiconductor thin film according to claim 1, wherein, in the laser beam shaping step, a sum of beam concave lengths of each concave pattern is shorter than a length of the beam.

14. The manufacturing method of a semiconductor thin film according to claim 1, wherein, in the laser beam shaping step, a part of the laser beam irradiated onto the semiconductor thin film is shaped into concave patterns of a plurality of different sizes or into concave patterns of a plurality of different shapes.

15. The manufacturing method of a semiconductor thin film according to claim 1, wherein, in the laser beam shaping step, a part of a side that is on an opposite side with respect to a scanning direction side of the irradiation pattern of the laser beam is shaped into said at least one concave pattern, and the laser beam is shaped such that a shape of the side on the opposite side of a scanning direction becomes different from a shape of a side on the scanning direction side.

16. A method of manufacturing a semiconductor thin film for growing a crystal grain on the semiconductor thin film, the method comprising the steps of:
  providing a mask having a beam shaped opening corresponding to a beam shape therein, the beam shaped opening including a first portion projecting into an interior of the beam shaped opening;
  irradiating a laser beam through the beam shaped opening to shape the laser beam into a continuous rectangular shaped irradiation pattern, a part of the rectangular shaped irradiation pattern along one side is shaped into a control pattern, said control pattern including at least one notch in the rectangular shaped irradiation pattern corresponding to said first portion and defining an area not to be irradiated;
  growing a band-form crystal grain on the semiconductor thin film based a position control of crystal grain boundaries established by the control pattern by irradiating the laser beam through the mask while scanning the laser beam.

17. The method as claimed in claim 16, wherein said control pattern is a comb shaped pattern having plural notches.

18. A manufacturing method of a semiconductor thin film for growing a crystal grain on a semiconductor thin film by irradiating a laser beam onto the semiconductor thin film formed on an insulating substrate, the method comprising a step of shaping a laser beam, wherein
  in the step of shaping the laser beam, an irradiation pattern of the laser beam to be irradiated onto the semiconductor thin film is shaped into a shape having at least one notch of a convex shape at a periphery of the irradiation pattern in a long axis direction of the irradiation pattern which has the long axis direction and a short axis direction.

19. The manufacturing method of a semiconductor thin film according to claim 18, wherein one crystal grain is formed for each position of the at least one notch by irradiating the laser beam onto the semiconductor thin film at least once.

20. The manufacturing method of a semiconductor thin film according to claim 18, further comprising a step of scanning over a surface of the semiconductor thin film by the laser beam in the short axis direction.

21. A manufacturing method of a semiconductor thin film for growing a crystal grain on a semiconductor thin film by performing scanning irradiation of the laser beam onto the semiconductor thin film formed on an insulating substrate, the method comprising a step of shaping a laser beam, wherein
  in the step of shaping a laser beam, an irradiation pattern of the laser beam to be irradiated onto the semiconductor thin film is shaped into a shape having at least one notch of a convex shape at a peripheral edge of the irradiation pattern which is in a perpendicular direction to a scanning direction.

* * * * *

UNITED STATES PATENT AND TRADEMARK OFFICE
CERTIFICATE OF CORRECTION

PATENT NO.        : 7,611,577 B2
APPLICATION NO.   : 11/094570
DATED             : November 3, 2009
INVENTOR(S)       : Mitsuru Nakata It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 312 days.

Signed and Sealed this

Twelfth Day of October, 2010

David J. Kappos
*Director of the United States Patent and Trademark Office*